United States Patent [19]

Orita et al.

[11] Patent Number: 6,008,687

[45] Date of Patent: Dec. 28, 1999

[54] SWITCHING CIRCUIT AND DISPLAY DEVICE USING THE SAME

[75] Inventors: Isamu Orita; Akihiko Kougami, both of Kokubunji; Shigeo Mikoshiba, Tokyo; Takeaki Okabe, Tokyo; Kouzou Sakamoto, Tokyo; Masahiro Eto, Fujisawa, all of Japan

[73] Assignee: Hitachi, Ltd., Tokyo, Japan

[21] Appl. No.: 08/758,411

[22] Filed: Nov. 29, 1996

Related U.S. Application Data

[63] Continuation of application No. 08/006,718, Jan. 2, 1992, abandoned, which is a continuation of application No. 07/398,857, Aug. 25, 1989, abandoned.

[30] Foreign Application Priority Data

Aug. 29, 1988 [JP] Japan .................................. 63-212465
Sep. 29, 1988 [JP] Japan .................................. 63-245446

[51] Int. Cl.⁶ .............................. H01L 41/00; H03K 5/08
[52] U.S. Cl. .......................... 327/515; 327/313; 327/314; 327/321
[58] Field of Search .................................. 327/310, 311, 327/312, 313, 314, 324, 327, 328, 387, 389, 375, 391, 426, 427, 430, 432, 433, 434, 436, 478, 315, 515, 514; 326/106, 109, 110

[56] References Cited

U.S. PATENT DOCUMENTS

| | | | |
|---|---|---|---|
| 2,901,669 | 8/1959 | Coleman | 307/278 |
| 3,060,331 | 10/1962 | Habisohn | 307/278 |
| 3,315,100 | 4/1967 | Amodei | 307/446 |
| 3,590,281 | 6/1971 | Russell | 307/278 |
| 3,769,524 | 10/1973 | Mathews | 307/446 |
| 4,079,370 | 3/1978 | Mikoshiba | 307/324 M |
| 4,189,749 | 2/1980 | Hiroshima et al. | 348/241 |
| 4,259,939 | 4/1981 | Coates | 307/300 |
| 4,267,469 | 5/1981 | Ohba et al. | 327/515 |
| 4,339,710 | 7/1982 | Hapke | 327/427 |
| 4,415,963 | 11/1983 | Rippel et al. | 363/135 |
| 4,424,455 | 1/1984 | Neely | 307/446 |
| 4,471,245 | 9/1984 | Janutka | 307/570 |
| 4,487,457 | 12/1984 | Janutka | 327/427 |
| 4,492,883 | 1/1985 | Janutka | 307/571 |
| 4,500,801 | 2/1985 | Janutka | 307/570 |
| 4,500,802 | 2/1985 | Janutka | 307/570 |
| 4,540,893 | 9/1985 | Bloomer | 307/571 |
| 4,611,134 | 9/1986 | Ando | 307/445 |
| 4,678,938 | 7/1987 | Nakamura | 327/515 |
| 4,705,963 | 11/1987 | Bax | 327/434 |
| 4,707,692 | 11/1987 | Higgins et al. | 340/805 |
| 4,728,828 | 3/1988 | Goodnough | 307/570 |
| 4,769,560 | 9/1988 | Tani et al. | 307/300 |
| 4,839,540 | 6/1989 | Veno | 307/446 |
| 4,859,878 | 8/1989 | Murayama | 307/446 |
| 4,864,216 | 9/1989 | Kalata et al. | 323/315 |
| 4,931,669 | 6/1990 | Higashisaka | 307/448 |
| 4,933,832 | 6/1990 | Schneider et al. | 363/143 |

FOREIGN PATENT DOCUMENTS

| | | | |
|---|---|---|---|
| 0253555 | 1/1988 | European Pat. Off. | 307/570 |
| 52-38824 | of 1977 | Japan . | |
| 0029643 | 3/1978 | Japan | 307/278 |
| 0088931 | 5/1983 | Japan | 307/570 |
| 0026320 | 2/1986 | Japan | 307/570 |
| 0181523 | 7/1988 | Japan | 307/570 |
| 0729847 | 3/1980 | U.S.S.R. | 307/446 |

OTHER PUBLICATIONS

"Energy Recovery Sustain Circuit for the AC Plasma Display", SID Digest, 1987, pp. 92–95, University of Illnois, Larry F. Weber and Mark B. Wood.

IEEE Standard Dictionary of Electrical and Electronics Terms; Jul. 1984; p. 278.

*Primary Examiner*—Terry D. Cunningham
*Attorney, Agent, or Firm*—Pennie & Edmonds LLP

[57] ABSTRACT

A switching circuit has switching elements for passing-through or cutting-off signals of a positive pulse, which is a rectangular pulse rising from a low level and falling after having kept a high level for a certain time as a high voltage input signal, and a negative pulse, which is a rectangular pulse falling from a high level and rising after having kept a low level for a certain time, the switching circuit being applied to a capacitive load driving device.

9 Claims, 19 Drawing Sheets

| VCON | VIN | VOUT |
|---|---|---|
| H | L | L |
| H | H | H |
| L | L | HOLD |
| L | H | H |

| VCON | VIN | VOUT |
|---|---|---|
| H | L | L |
| H | H | H |
| L | L | H |
| L | H | H |

SWITCHING CIRCUIT AND DISPLAY DEVICE USING THE SAME

This is a continuation of application Ser. No. 08/006,718, filed Jan. 2, 1992, now abandoned, which is a continuation of application Ser. No. 07/398,857, filed Aug. 25, 1989, now abandoned.

BACKGROUND OF THE INVENTION

The present invention relates a switching circuit for passing-through or cutting-off continuous or intermittent high voltage signals and a display device using same, and in particular to a switching circuit suitable for controlling a high voltage pulse signal by means of a low voltage signal and a display device using same.

Heretofore a switching circuit for passing-through or cutting-off an input signal by means of semiconductor elements is discussed in "How to use FETs" pp. 110–114, published by CQ Publishing Co. Ltd., 1983, in which a method is described, by which a small signal is imputted in the source of an MOS transistor and an output signal is taken out from the drain, whereby the potential of the body (substrate) is set with respect to the source or the drain so that the p-n junctions therebetween are never biased in the forward direction under any conditions and the signal conduction and cutting-off is controlled by the gate voltage.

However by the prior art technique no attention is paid to passing-through or cutting-off high voltage signals nor to utilizing a stray diode between the drain and the body.

A first object of the present invention is to provide a simple switching circuit utilizing a stray diode existing between the drain and the body of an MOS transistor.

A second object of the present invention is to provide a high voltage signal switching circuit, which controls particularly the passing-through and cutting-off of a high voltage signal by means of a low voltage signal.

A third object of the present invention is to provide a capacitive load driving device, which drives a capacitive load with a low electric power consumption, and a display device using same.

SUMMARY OF THE INVENTION

The above objects can be achieved by using an N-type MOS transistor as a switching element for a positive pulse input signal; connecting at least a resistor or a protection diode or both between the gate and the source of the MOS transistor stated above, the drain of the MOS transistor stated above serving as a positive pulse input terminal, the source of the MOS transistor stated above serving as an output terminal; and controlling the switching of the MOS transistor stated above by means of a second transistor, which is a current control device. A positive pulse means a rectangular pulse, which rises from a low level with an input signal and falls after having kept a high level for a certain time.

Further the above objects can be achieved by using a P-type MOS transistor as a switching element for a positive pulse input signal; connecting at least a resistor or a protection diode or both between the gate and the source of the MOS transistor stated above, the source of the MOS transistor stated above serving as a positive pulse input terminal, the drain of the MOS transistor stated above serving as an output terminal; and controlling the switching of the MOS transistor stated above by means of a second transistor, which is a current control device.

Still further the above objects can be achieved by using an N-type MOS transistor as a switching element for a negative pulse input signal; connecting at least a resistor or a protection diode or both between the gate and the source of the MOS transistor stated above, the source of the MOS transistor stated above serving as a negative pulse input terminal, the drain of the MOS transistor stated above serving as an output terminal; and controlling the switching of the MOS transistor stated above by means of a second transistor, which is a current control device. A negative pulse means a rectangular pulse, which falls from a high level and rises after having kept a low level for a certain time.

Still further the above objects can be achieved by using a P-type MOS transistor as a switching element for a negative pulse input signal; connecting at least a resistor or a protection diode or both between the gate and the source of the MOS transistor stated above, the drain of the MOS transistor stated above serving as a negative pulse input terminal, the source of the MOS transistor stated above serving as an output terminal; and controlling the switching of the MOS transistor stated above by means of a second transistor, which is a current control device.

The second current controlling transistor described above works for switching-off that MOS transistor switching element, when the source of the MOS transistor stated above serves as an input terminal for a positive or negative pulse, and it works so as to bias the switching element to switch-on, when the drain of the MOS transistor stated above serves as an input terminal.

Further the switching circuit works similarly, even if the MOS transistor stated above serving as the switching element is replaced by a bipolar transistor.

The switching circuit according to the present invention can be used appropriately for a control circuit for the display in a display device, in which high voltage signals generated according to the signal for image display are applied to display elements. Furthermore, at this time, a still greater effect can be obtained, if it is used, combined with an energy recovery circuit.

DESCRIPTION OF THE PREFERRED EMBODIMENTS

Figure 1:
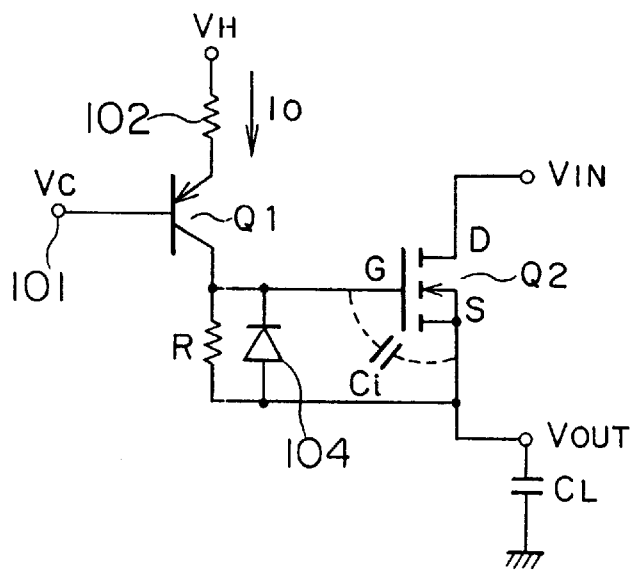
FIG. 1 is a circuit diagram showing an embodiment of the present invention.

Hereinbelow some embodiments of the present invention will be explained in detail, referring to the drawings.

Figure 2:
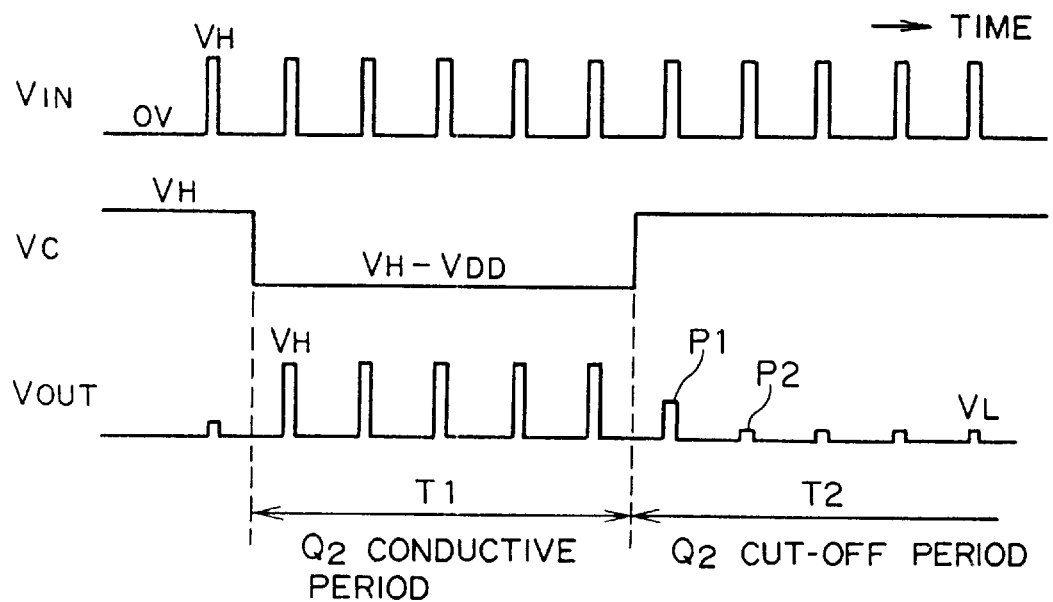
FIG. 2 is a time chart indicating a timing of operation of the circuit shown in FIG. 1.

FIG. 1 is a circuit diagram showing a switching circuit, which is an embodiment of the present invention, and FIG. 2 is a time chart indicating a timing of operation thereof.

In FIG. 1, Q1 represents a PNP type transistor as a bipolar transistor for the current circuit stated above; Q2 an N channel MOS FET acting as a driving element, which passes-through or cuts-off high voltage signals; and $C_L$ a capacitive load.

In the basic circuit described in the present embodiment, the FET Q2 plays the role of the switch, which passes-through and cuts-off a high voltage pulse $V_{IN}$ by the gate voltage $V_G$ of the FET Q2 according to a low voltage input signal $V_C$ (101). During conduction, the high voltage pulse $V_{IN}$ is applied from the drain D side to the source S side and thus the FET Q2 has a function to feed the capacitive load $C_L$.

Now the operation thereof will be explained, according to the time chart indicated in FIG. 2.

Since the transistor Q1 works in the emitter grounded type, an "L" level ($V_H$-$V_{DD}$) of $V_C$ indicated in FIG. 2 is applied to the base B so that the transistor Q1 is turned on. The voltage at the emitter E is higher than the base voltage by about 0.7 V, if the transistor is a silicon element. The difference between this emitter voltage and the high power supply voltage $V_H$ is applied across a resistor 102, producing a current $I_0$.

The current $I_0$ flows out from the collector C of the transistor Q1 and passes through a resistor R, while charging the gate input capacitance $C_i$ of the FET Q2. In this way a voltage is generated between the gate and the source of the FET Q2.

Figure 3:
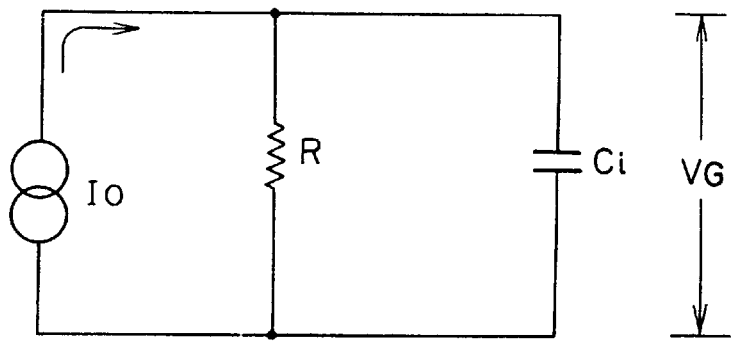
FIG. 3 is an equivalent circuit diagram at the charging of the circuit indicated in FIG. 1.

FIG. 3 shows an equivalent circuit of the circuit charging the gate input capacitance $C_i$ of the FET Q2. The gate voltage $V_G$ is given by the following equation.

$$V_G = I_0 R\left(1 - e^{-\frac{1}{\tau}t}\right) \quad (1)$$

where $\tau = C_i R$; R is the resistance of the resistor R in FIG. 1 which is connected to the gate and the source of the FET Q2; and $I_0$ represents the intensity of the current and where a relation expressed by $R < T/C_i$ is valid, where a T is the period of a high voltage pulse of the input signal $V_{IN}$.

$\tau$ in the above equation indicates the rise time constant of the FET Q2. Supposing that the resistance R is e.g. 30 kΩ and $C_i$ is e.g. 100 pF, $\tau$ is equal to 3 μsec. As it can be seen from E$_q$. (1), it is possible to determine the current intensity $I_0$ and the time constant $\tau$ independently from each other. In order to drive the FET Q2 with a high speed, the rise time constant $\tau$ should be as small as possible.

Concretely speaking, since the gate input capacitance $C_i$ is determined by the structure of the element. However, if the resistance R is small, the voltage between the gate G and the source S of the FET Q2 is lower than the threshold value ($V_{TH}$) and thus the conduction is insufficient. Therefore the current intensity $I_0$ is increased so that the voltage between the gate G and the source S is above the threshold value stated above. However, if this voltage is too high, the voltage between the gate G and the source S exceeds the withstand voltage $V_{GS}$ max and destroys the element. In order to prevent it, a zener diode 104 is connected inparallel with the resistor R between the gate G and the source S. Consequently, concerning the product of R and $I_0$, the following relation is valid:

$$\frac{V_{TH}}{1 - e^{-T/C_i R}} < I_0 R < \frac{V_{GSmax}}{1 - e^{-T/C_i R}},$$

In this way it is possible to drive the gate with a high speed to reduce the resistance R between the drain D and the source S so that the FET Q2 serving as the switching element is in the conductive state.

Now the $T_2$ period of the low voltage input signal $V_C$ in FIG. 2 is explained.

The transistor Q1 and the FET Q2 are in the cut-off state by applying the low voltage input signal $V_C$ at the "H" level to the input terminal 101.

The electric charge stored in the capacitive load $C_L$ and the gate input capacity $C_i$ is discharged towards the "L" level (0V in FIG. 2) of the high voltage pulse-shaped drain voltage on the drain D side during a period of time where there is no pulse, passing through the parasitic diode between the drain and the body. When the electric charge stored in the capacitive load on the source S side is discharged gradually, the peak value of the pulse becomes lower and lower, as indicated by P1 and P2 in FIG. 2, and finally it reaches the $V_L$ level.

According to the embodiment described above, in the case where a high voltage of 200–300 V is applied, the switch, which required heretofore a more complicated construction, can have a more simple construction capable of driving the driving element at the output stage with a low voltage.

Figure 4:
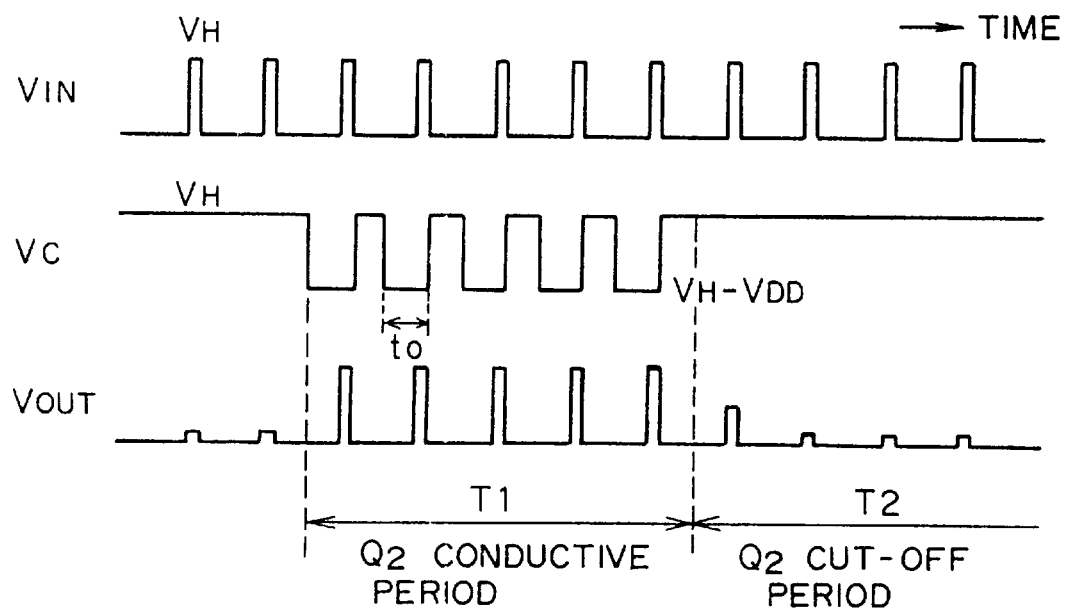
FIG. 4 is a time chart indicating a timing of operation of the circuit according to the present invention indicated in FIG. 1.

Next FIG. 4 indicates an example, in the case where the control signal $V_C$ for the transistor $Q_1$ in FIG. 1 is a pulse signal synchronized with the pulse of the high voltage input signal $V_{IN}$. This reduces the electric power for driving the gate of the FET Q2 during the conductive period $T_1$ by making the current $I_0$ flowing through the transistor $Q_1$ by a pulsed current. As indicated in FIG. 4, the signal $V_C$ inputted in the base of the transistor $Q_1$ during the conductive period $T_1$ of the FET Q2 is composed of pulses, whose duration at the "L" level is $t_0$. At this time, as a condition, under which the MOS FET Q2 is satisfactorily turned on and the gate voltage doesn't exceed the withstand voltage ($V_{GSmax}$), similarly to that described above, the following inequality should be valid;

$$\frac{V_{TH}}{1 - e^{-t_0/CiR}} < I_0 R < \frac{V_{GSmax}}{1 - e^{-t_0/C_iR}}.$$

Next a case where a PNP transistor (Q1) is used for the bipolar transistor for the current circuit described above and a P channel FET (Q2) for the switching element will be explained referring to FIGS. 5 and 6.

Figure 5:
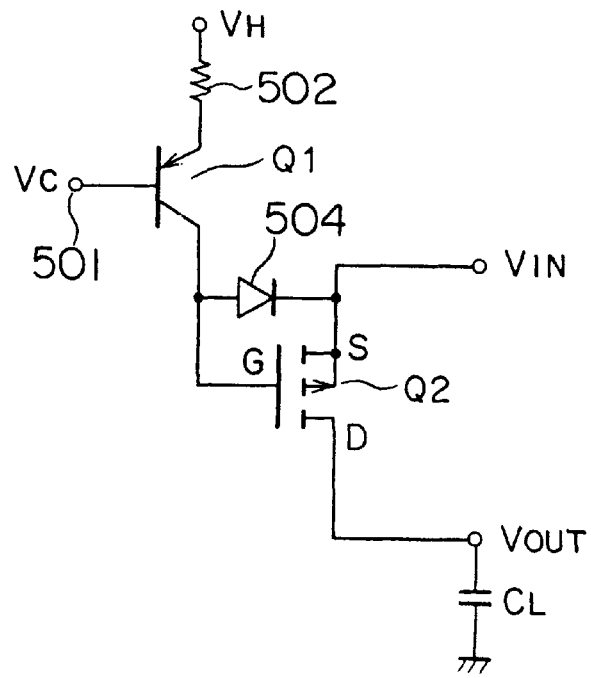
FIG. 5 is a circuit diagram showing an embodiment of the present invention.
Figure 6:
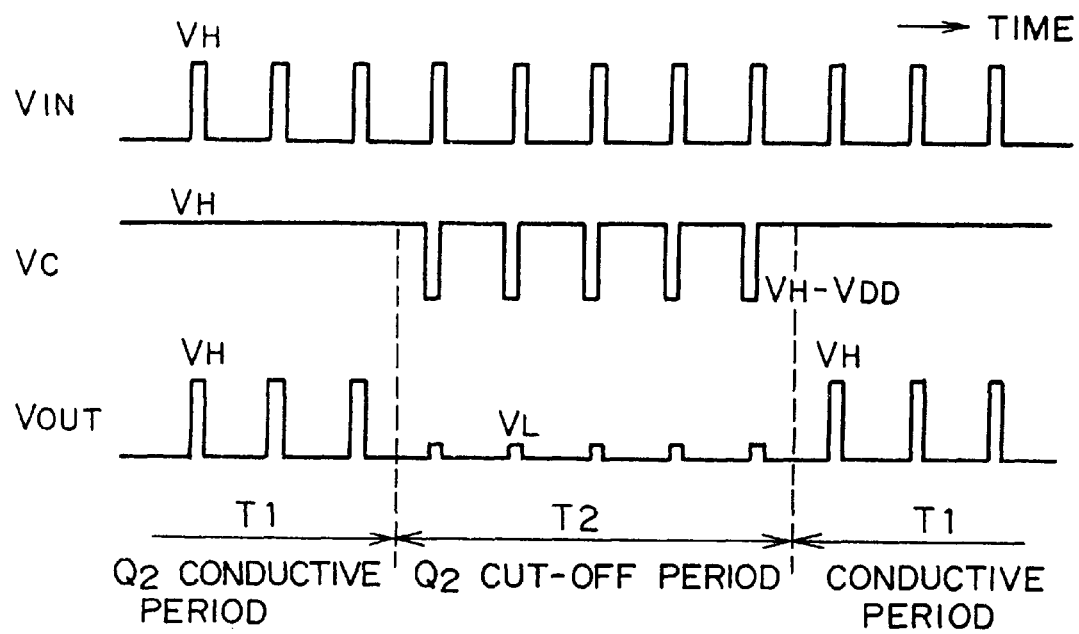
FIG. 6 is a time chart indicating a timing of operation of the circuit construction indicated in FIG. 5.

In FIG. 5, the source of the P channel FET (Q2) serves as the input terminal for the high voltage signal $V_{IN}$ and the drain thereof as the output terminal, in which a diode 504 is connected between the gate and the source. The emitter side of the transistor Q1 in the current control circuit is connected with the power source $V_H$ having the same level as the H level of the high voltage signal $V_{IN}$ through a resistor 502 controlling the intensity of the current. FIG. 6 shows variations of the input signal $V_{IN}$, the control signal $V_C$ and the output signal $V_{OUT}$ for this switching circuit construction. When the FET Q2 serving as the switching element is turned to the conductive state ($T_1$ in FIG. 6), it turns off the current control circuit. At this time, when the high voltage pulse is applied to $V_{IN}$, a potential difference takes place automatically between the gate and the source of the FET Q2 owing to the Zener diode (504 in FIG. 5), which turns on the FET Q2. Then, when the FET Q2 is switched off, as indicated by $V_C$ in FIG. 6, a negative pulse synchronized with the high voltage signal $V_{IN}$ is applied to the base 501 of the transistor Q1 in FIG. 5. At this time the potential at the gate of the FET Q2 is $V_H$ owing to the fact that the transistor Q1 is switched on and thus the FET Q2 is switched off, even if the pulse amplitude of the high voltage signal $V_{IN}$ is $V_H$, because there is no potential difference between the gate and the source thereof.

Figure 7:
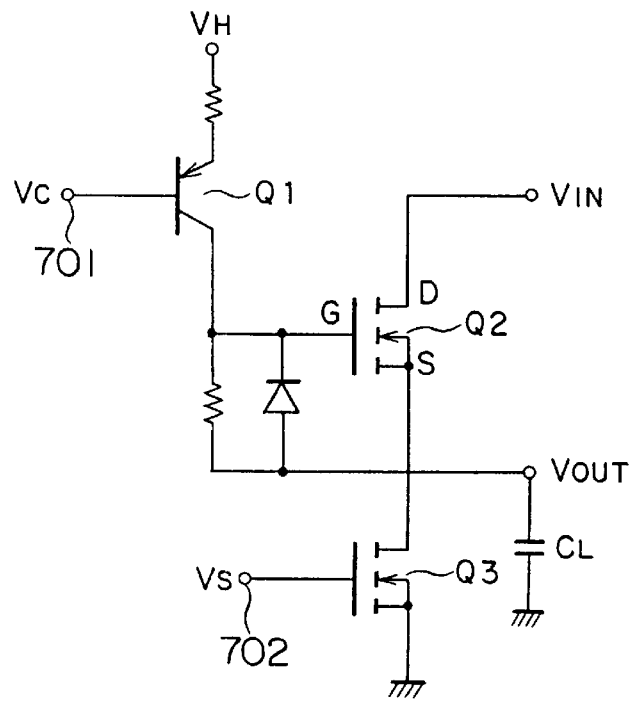
FIG. 7 is a circuit diagram showing an embodiment of the present invention.
Figure 8:
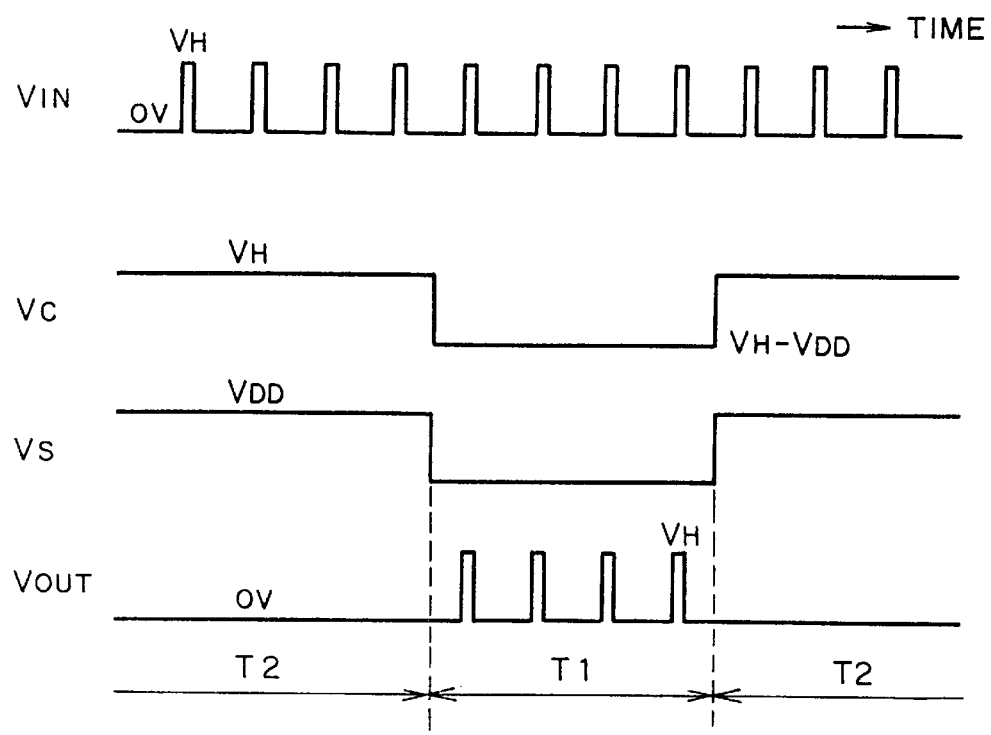
FIG. 8 is a time chart indicating a timing of operation of the circuit construction indicated in FIG. 7.

Next a case where a voltage hold circuit is added to the switching circuit indicated previously in FIG. 1 will be explained, referring to FIGS. 7 and 8.

A case where an N channel FET Q3 is used as a voltage hold circuit element will be described.

The transistor Q1 serving as a current source element has the same function as that of the transistor Q1 indicated in FIG. 1. Here the voltage $V_C$ indicated in FIG. 8 is applied to the input terminal 701. In the period T1, similarly to the period T1 indicated in FIG. 2, the FET Q2 is switched on and thus the high voltage pulse-shaped drain voltage $V_{IN}$ applied to the drain D side produces the source voltage $V_{OUT}$ on the source S side, which is applied to the capacitive load $C_L$.

Then, in the period T2 also, similarly to the period T2 indicated in FIG. 2, the FET Q2 is switched off. The electric charge stored in the input capacitance and the capacitive load during the T1 period is discharged towards the "L" level (OV) of the high voltage pulse-shaped drain voltage $V_{IN}$, passing through the parasitic diode of the FET Q2. At this time, in order to fix the potential on the source S side, a hold input signal $V_S$ indicated in FIG. 8 is applied to the gate G input terminal 702 of the FET Q3 serving as the voltage hold element. The FET Q3 is switched on by the "H" level of the hold input signal $V_S$.

In this way the potential $V_{OUT}$ at the drain of the FET Q3 is O V and held. Consequently, as indicated in FIG. 8, the potential $V_{OUT}$ at the source S of the FET Q2 is fixed at the "L" level (O V) and held. Although explanation has been made in the above by using an N channel FET for the FET Q2, a P channel FET can be operated similarly with the voltage hold circuit. Further, not only the FET but also a transistor (NPN or PNP), to which a diode is connected in parallel, can be operated similarly.

Figure 9:
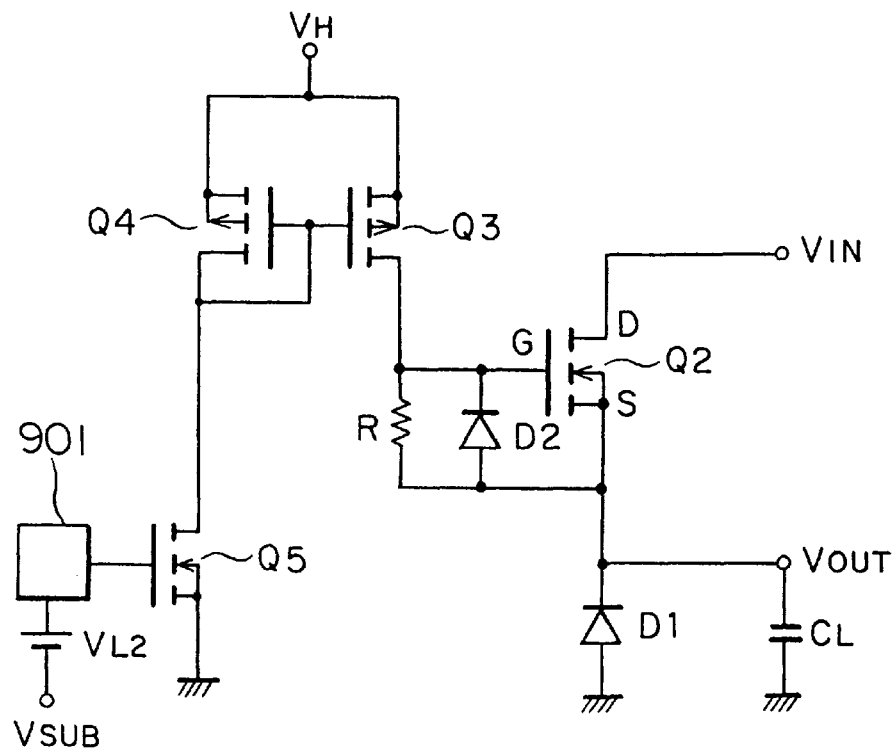
FIG. 9 is a circuit diagram showing an embodiment of the present invention.

FIG. 9 is a circuit diagram showing another embodiment of the present invention. Contrarily to the fact that in the circuit indicated previously in FIG. 1 the FET Q2 is switched by a signal on the high voltage power source side, in the circuit in the present embodiment the FET Q2 is switched by a signal on the ground potential side. A resistor R and a Zener diode have the same functions as those explained, referring to FIG. 1.

A P channel FET Q3 is an element for switching the current $I_0$ just as the transistor Q1 indicated in FIG. 1 and this element is driven with a level shifted so that it can be controlled by a signal voltage between the ground potential and the low voltage power source voltage $V_{DD}$ by means of a P channel FET Q4 and an N channel FET Q5 constituting a current mirror circuit together with the FET Q3 described above.

Further the applied drain voltage $V_{IN}$ has the same waveform as that indicated in FIG. 2. Reference numeral 901 represents a signal circuit for driving the N channel FET Q5. It includes e.g. a shift register circuit and a latch circuit and has a function to convert image signals inputted in serial into parallel signals to output the signals in parallel. The power source voltage for this signal circuit is the low voltage power source voltage $V_{DD}$.

In this circuit, as described later, the PN junction isolation semiconductor layer is set at a voltage lower than the ground voltage so that the PN junction for the component isolation is never biased in the forward direction, even if the output voltage $V_{OUT}$ is lowered to a value below the ground voltage.

A diode D1 in FIG. 9 is provided so that the output voltage $V_{OUT}$ doesn't drop beyond the ground potential.

Figure 10:
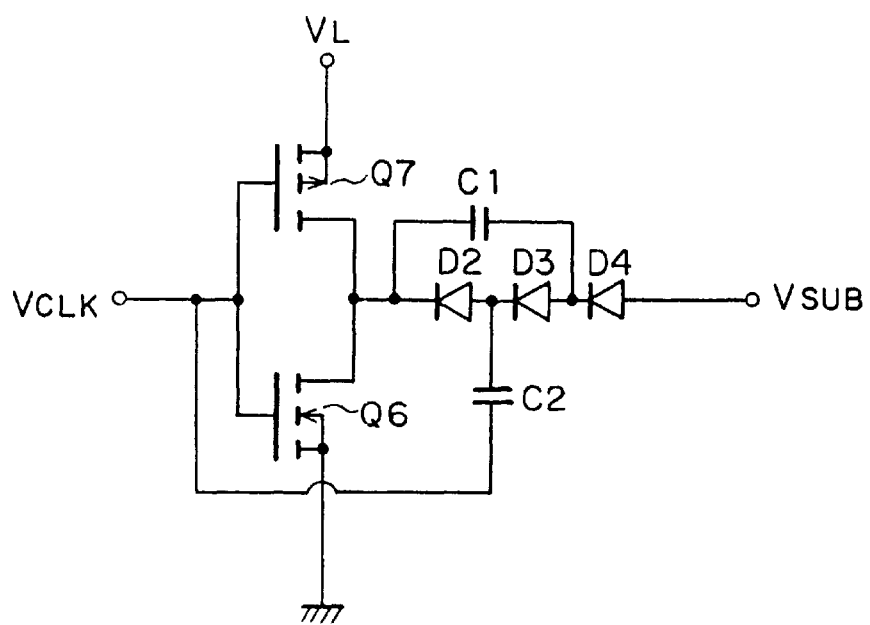
FIG. 10 is a circuit diagram of a negative voltage circuit, which can be used in the circuit indicated in FIG. 9.

FIG. 10 illustrates an example of the construction of a negative voltage circuit, which can be used in the circuit indicated in FIG. 9. This circuit can lower the voltage of the P conductivity type semiconductor layer for the component isolation to a voltage lower than the ground voltage by about 7 V according to the charge pump principle by using a clock signal $V_{CLK}$ applied to a capacitor $C_Z$ and a signal obtained by applying the clock signal $V_{CLK}$, whose sign is inverted by an inverter circuit constituted by an N channel FET Q6 and a P channel FET Q7, to the cathode side of a diode $D_2$.

Figure 11:
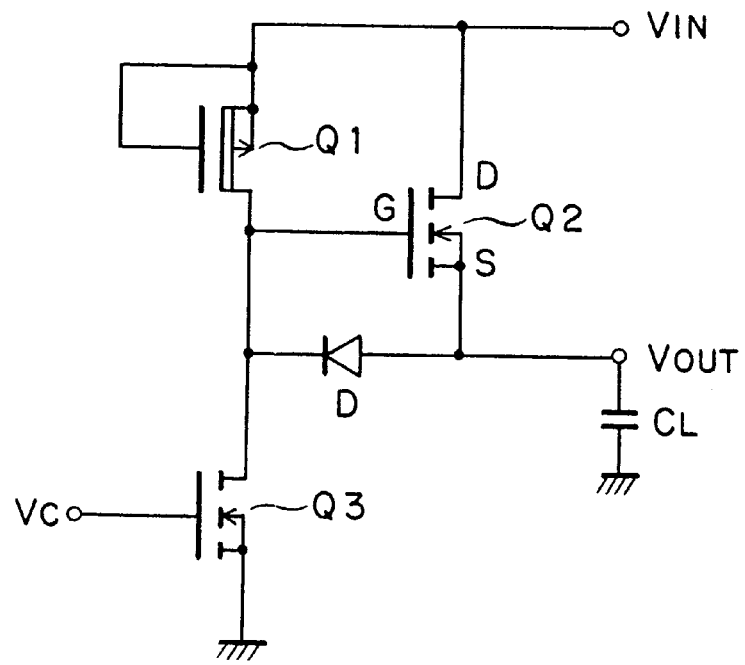
FIG. 11 is a circuit diagram of another embodiment of the present invention.
Figure 12:
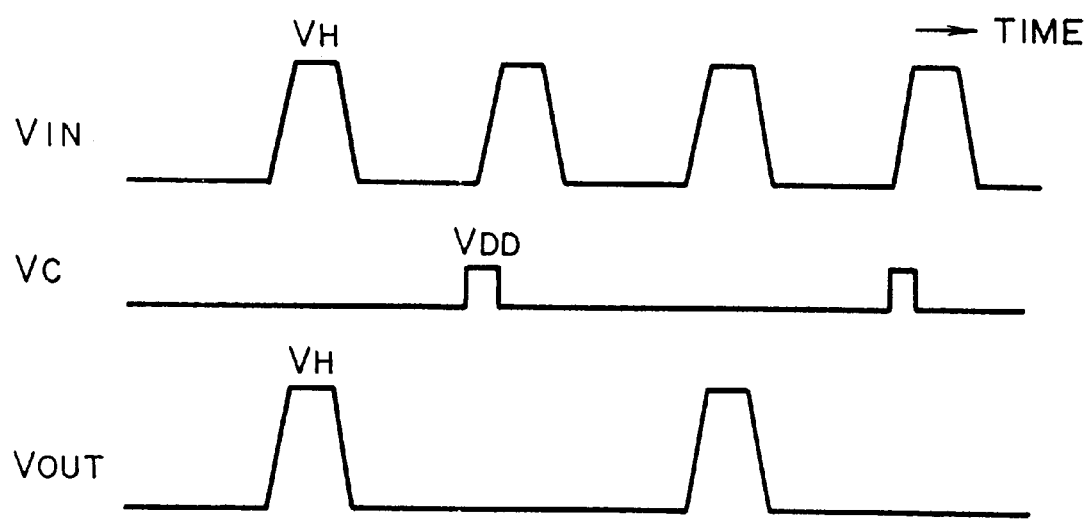
FIG. 12 is a time chart indicating a timing of operation of the circuit construction indicated in FIG. 11.

FIG. 11 is a circuit diagram of another embodiment of the present invention and FIG. 12 shows working waveforms therefor, in which $V_{IN}$ indicates a pulse input voltage; $V_{OUT}$ the output voltage; $V_C$ the switch control voltage; $V_H$ the power source voltage for a high voltage circuit; and $V_{DD}$ the power source voltage for a low voltage circuit (logic circuit). Q2 indicates an N channel MOS transistor for switching and Q3 an N channel MOS transistor disposed for controlling the switch so as to be in the conductive mode or in the cut-off mode. D is a diode, which acts as the current path to the ground, when the source voltage of the MOS transistor Q2 falls. Further it is also possible to use for protecting the gate of the MOS transistor. Q1 is a depletion type P channel MOS transistor.

Hereinbelow the working mode of the circuit indicated in FIG. 11 will be explained, referring to FIG. 12. By the conductive mode of the switch, which sets the control voltage $V_C$ at the "L" level, since current is supplied from the depletion type MOS transistor to the gate of the MOS transistor Q2, the MOS transistor Q2 is in the ON state. For this reason, when a voltage pulse is applied to the input terminal $V_{IN}$, the source voltage (output voltage $V_{OUT}$) rises, following the rise of the drain voltage (input voltage $V_{IN}$). When the input voltage $V_{IN}$ falls, since the parasitic diode existing between the drain and the body of the MOS transistor Q2 is biased in the forward direction, the output voltage $V_{OUT}$ falls also, following it. That is, it is possible to make the input voltage pulse pass-through to the output side. On the other hand, by the switch cut-off mode, where the control voltage $V_C$ is at the "H" level, it is performed by the MOS transistor Q3 to draw-in the current holding the gate and the source of the MOS transistor Q2 at the ground level so that the MOS transistor is in the OFF state. For this reason, even if a voltage pulse is applied to the input terminal $V_{IN}$, the source voltage (output voltage $V_{OUT}$) doesn't follow the rise of the drain voltage (input voltage $V_{IN}$) to rise. That is, it is possible to cut off the input voltage pulse so as not to make it pass-through to the output side.

In FIG. 11, an insulated gate type bipolar transistor or an NPN transistor, with which a diode is connected in parallel, may be used for the switching MOS transistor Q2.

In the present embodiment a depletion type MOS transistor Q1 or a junction gate type transistor of depletion type is disposed between the drain and the gate as means for raising also the potential at the gate at the rise of the potential at the drain. For this reason an advantage can be obtained that a constant current can be supplied, almost independently of the voltage between the gate and the drain of the MOS transistor. Although in the present invention a P channel depletion type MOS transistor is used, the same effect can be obtained also if an N channel depletion type MOS transistor, in which the gate and the source are connected, is used.

Figure 13:
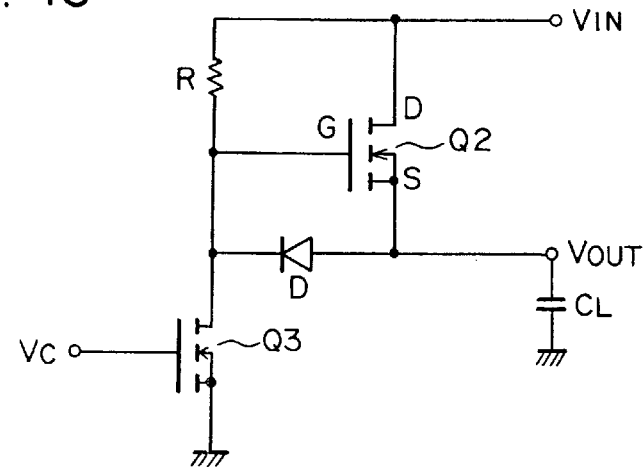
FIGS. 13, 14 and 15 are circuit diagrams showing still other embodiments of the present invention.

FIG. 13 is a circuit diagram of another embodiment of the present invention. In the present embodiment a resistor R is used as means for raising the potential at the gate at the rise of the potential at the drain. A resistor made of polycrystalline silicon, which has a small parasitic capacitance and with which a high maximum applicable voltage can be easily realized, is suitable for this resistor.

Figure 14:
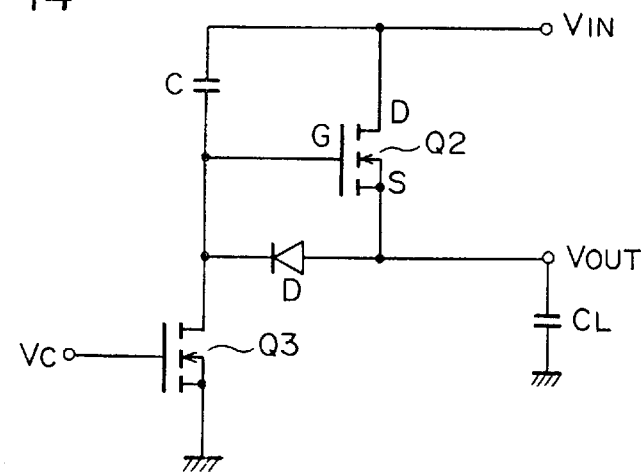

FIG. 14 is a circuit diagram of still another embodiment of the present invention. In the present embodiment a capacitor C is used as means for raising the potential at the gate at the rise of the potential at the drain. For this reason the present embodiment has an advantage that the driving current for switching on the MOS transistor Q2 with respect to those required in the embodiments indicated in FIGS. 11 and 13.

Figure 15:
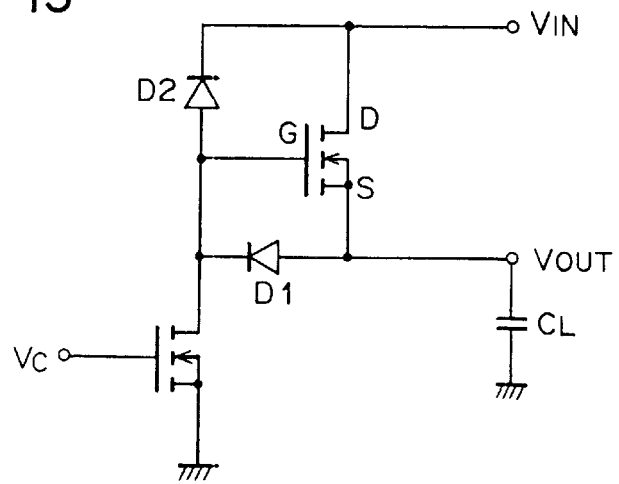

FIG. 15 is a circuit diagram of still another embodiment of the present invention. In the present embodiment a diode D2 is used as means for raising the potential at the gate at the rise of the potential at the drain. In the case of the present embodiment the diode D2 is used as the capacitor described in the embodiment indicated in FIG. 14. The case where the diode is used has an advantage that a high voltage input pulse can be dealt with, because it is easy to use a high voltage between the gate and the drain.

Figure 16:
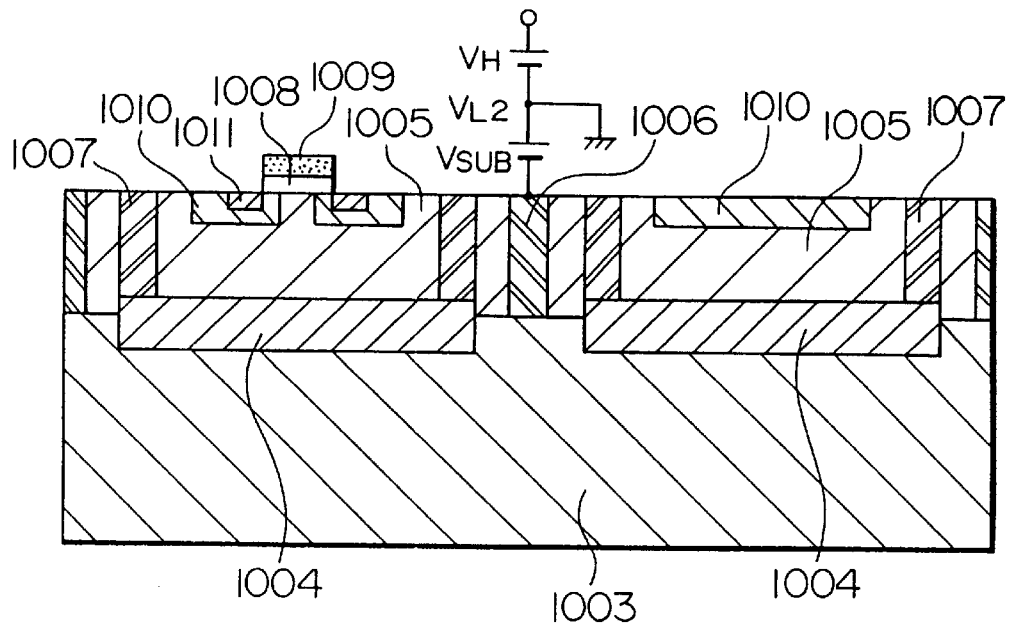
FIG. 16 is a cross-sectional view of an integrated circuit.

FIG. 16 is a cross-sectional view of the state, where the FET Q2 and the diode D1 in FIG. 9 are formed in an integrated circuit. As described previously, the diode D1 acts as a hold circuit for preventing the output voltage $V_{OUT}$ being lowered to a value below the ground voltage. In the circuit indicated in FIG. 16, the potential of P conductivity type semiconductor layers 1003 and 1006 for the component isolation is set at a value below the ground voltage so that even if the output voltage $V_{OUT}$ is lowered below the ground voltage, the PN junction for the component isolation (between 1003 and 1004) is never biased in the forward direction.

Explaining more in detail, the present figure shows the cross-sectional view of the semiconductor device indicating the connecting point of $V_{SUB}$ indicated in FIGS. 9 and 10 and a wiring scheme of the power source. The semiconductor device indicated in the present figure has a structure, in which the semiconductor element is isolated from the P conductivity type semiconductor substrate 1003 by a P conductivity type diffusion layer 1006. The left side of the present figure shows a vertical type MOS transistor, in which the source is an N conductivity type diffusion 1011; the body is a P conductivity type diffusion layer 1010; and the drain is an N conductivity type diffusion layer 1007 and an N conductivity type buried layer 1004. On the other hand the right side shows the cross-sectional view of the diode D1 indicated in FIG. 9, in which the anode is a P conductivity type diffusion layer 1010, and the cathode is N conductivity type diffusion layers 1005, 1004 and 1007.

The cross-sectional view itself of the present semiconductor device is heretofore well-known. However a feature of the present structure consists in that the potential of the P conductivity type semiconductor layers 1006 and 1003 for the component isolation is not egual to the ground voltage but it is set a value lower than the ground voltage by $V_{L2}$, serving as $V_{SUB}$. For example, when the output voltage $V_{OUT}$ is lowered below the ground voltage, this means that the cathode region (1005, 1004 and 1007) of the diode on the right side in FIG. 16 is lowered below the ground voltage.

In the case, where the potential of the P conductivity type semiconductor substrate is set at the ground voltage, as it is the case by the prior art method, the PN junction between the P conductivity type layer 1003 and the cathode region described above is biased in the forward direction. Therefore current flows through the P conductivity type semiconductor layer 1003 for the component isolation and a parasitic bipolar transistor existing between adjacent elements is turned to the ON state, which causes an erroneous operation, which gives rise to a problem. This can be prevented owing to the present structure.

Further, since the junction capacity with respect to the substrate, i.e. referring to the example indicated in FIG. 16, the capacity between the drain region 1004 of the MOS transistor and the substrate 1003, is reduced, another effect can be also obtained that the elements isolated by the PN junction can be driven with a high speed.

In order to set the voltage of the P conductivity type semiconductor layer for the component isolation at a value lower than the ground voltage by $V_{L2}$, an external power source may be used. However, by using the negative voltage circuit as indicated in FIG. 10, the object of obtaining the voltage $V_{SUB}$ of the P conductivity type semiconductor layer for the component isolation can be achieved without using any external negative voltage source.

Figure 17:
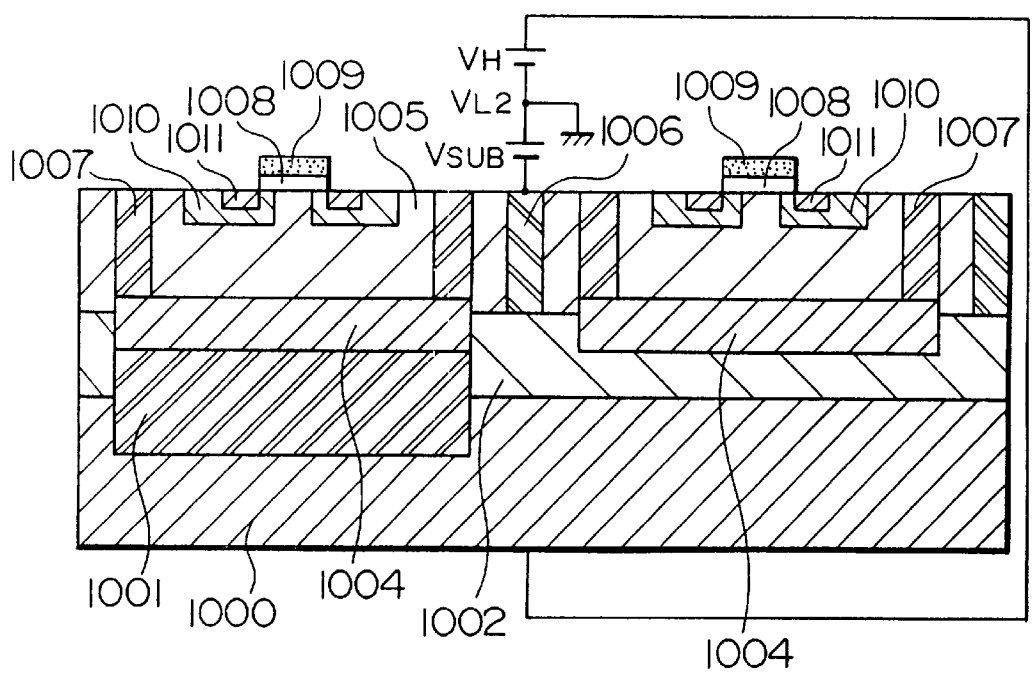
FIG. 17 is a cross-sectional view of another embodiment of the integrated circuit.

FIG. 17 is a cross-sectional view of another embodiment of the semiconductor device described above by the method of applying the substrate voltage and a wiring diagram of the power source.

The semiconductor device indicated in the present figure is a semiconductor device, in which a vertical type MOS transistor (on the left side in the figure), in which an N conductivity type substrate acts as the drain, and a vertical type MOS transistor having a structure similar to that indicated on the left side in FIG. 16, in which the component isolation is effected by a P conductivity type epitaxial layer 1002 and a P conductivity type diffusion layer 1006, coexist. The figure shows also the method of applying the substrate voltage therefor.

In the present figure, as described above, since the P conductivity type epitaxial layer 1002 and the P conductivity type diffusion layer 1006 act as the P conductivity type semiconductor layer for the component isolation, wiring is effected so as to set the potential of this region at a value below the ground voltage. In the present example of structure a parasitic bipolar transistor, in which an N conductivity type layer 1000 serves as the collector; the P conductivity type layer 1002 as the base; and an N conductivity type layer 1004, is originally apt to work.

As described above, when generally the potential of the P conductivity type semiconductor layer used for the component isolation in a PN junction isolation type semiconductor integrated circuit device is lowered below the ground voltage, even if the potential at the output terminal is lowered below the ground voltage, depending on the state of the load, it is possible to prevent that the parasitic element is turned to the ON state by the fact that the PN junction for the component isolation is biased in the forward direction, which gives rise an erroneous operation, by setting the potential of the P conductivity type semiconductor layer used for the component isolation at a still lower value and further another effect can be obtained that the element can be driven with a high speed.

Figure 18:
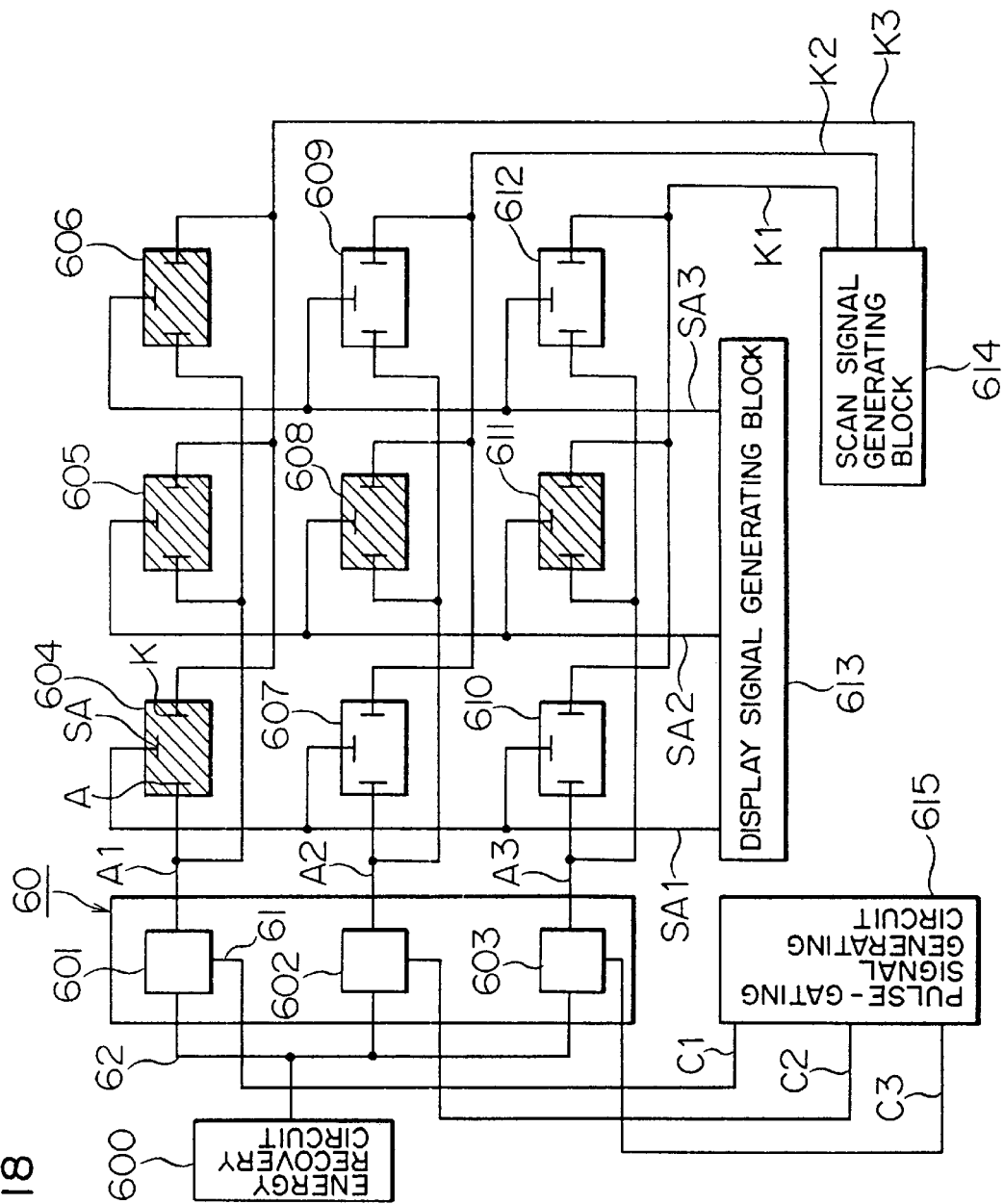
FIG. 18 is a scheme showing the circuit construction, when the present invention is applied to a matrix display device.
Figure 19:
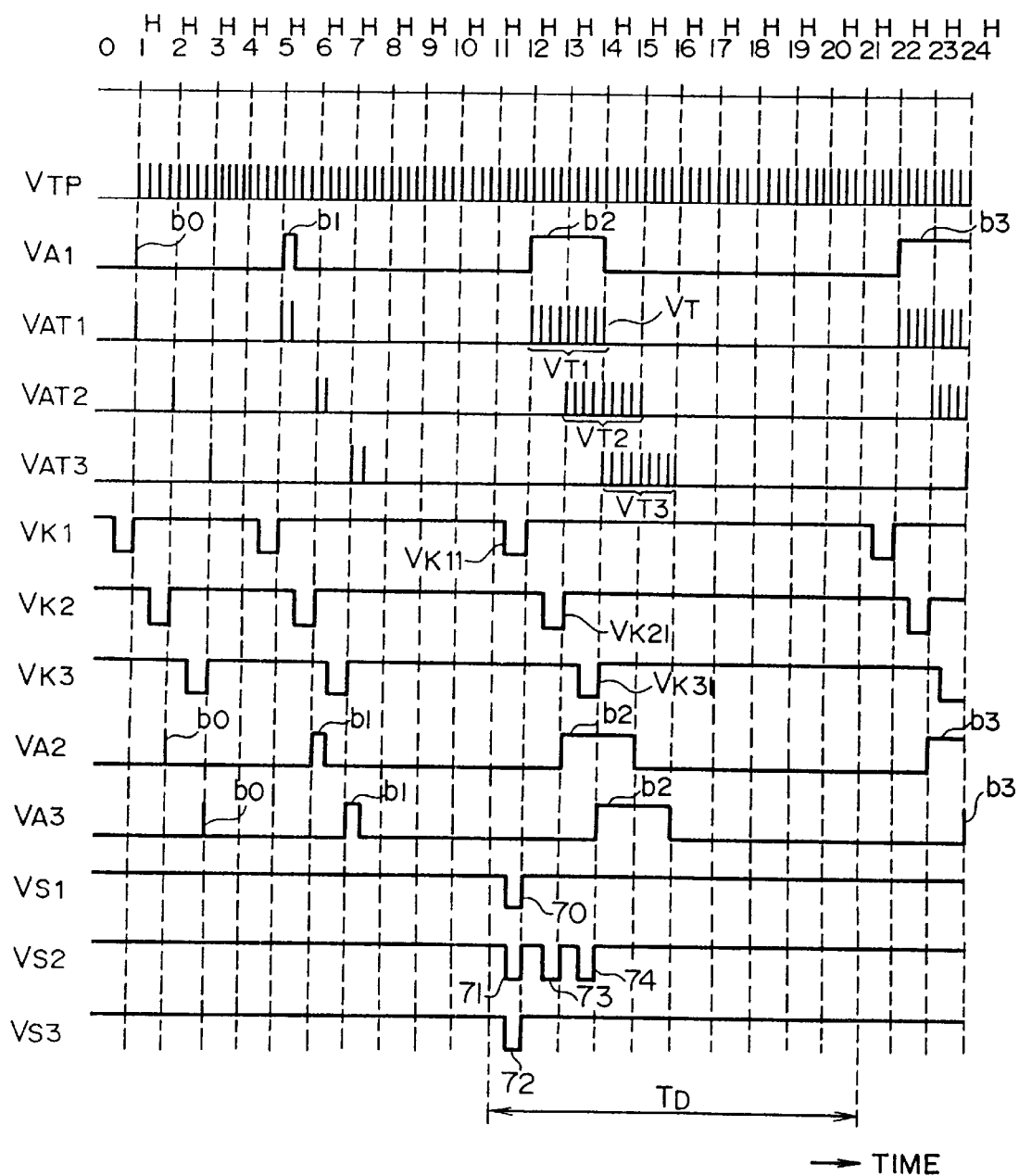
FIG. 19 shows an example of voltage waveforms applied to different electrodes in the circuit in FIG. 18.

Next an example, in which the present switching circuit is used in a display device, is explained, referring to FIGS. 18 and 19. In the present embodiment discharge cells are used as an example of the capacitive load.

In the case where the discharge cells are driven by image signals, the discharge cells are arranged vertically and horizontally, as indicated in FIG. 18, and the image signals are applied to electrodes thereof. One of the discharge cells used in the present embodiment has a 3-electrode structure, as indicated in FIG. 18, and consists of an anode electrode A, a cathode electrode K and a subanode electrode SA. In the present embodiment a case where the discharge cells are arranged in 3 lines and 3 rows will be explained.

The basic construction of the display device consists of an anode driving system feeding the anode electrode A, a scanning signal generating block 614 for generating signals applied to the cathode electrode K and a display signal generating block 613 for generating display signals applied to the subanode electrode SA. Here the anode driving system consists of an energy recovery circuit 600, which generates a high voltage pulse $V_{TP}$ (same waveform as $V_{IN}$) and at the same time recovers electric power, a group of switching circuits 60 having a pulse distributing function for feeding each of lines for the anode electrode A and a pulse-gating generating circuit 615 for giving a pulse distribiting signal.

In general, in the case where a capacitive load is driven, since the load capacity and the stray capacity of the circuit are charged up at the rise of the high voltage pulse, transient current flows. On the other hand, also at the fall of the high voltage pulse, since electric charge stored in the capacities described above is discharged, transient current flows. Since the discharge cells as a load constitute a capacitive load, transient current flows and electric power consumption is very great.

In order to reduce electric power consumed in the display device, as described above, generally an energy recovery circuit is used. Here the energy recovery circuit is a circuit consisting of a coil, a capacitor and a switching element, which stores the electric charge in the capacitor described above without consuming it in the resistor.

In order to recover the electric power with a high efficiency, it is necessary to dispose an energy recovery circuit and to recover the high voltage signal from each of the anode electrode A or distribute it to each of the anode electrodes A. For this purpose a pulse distributer is necessary, which can recover and distribute the high voltage signal in both the directions. The switch described above according to the present invention can be used for this purpose, as described below.

In the example of construction indicated in FIG. 18, in order to reduce the electric power of the signal applied to the anode electrode A, an energy recovery circuit is used and the group of switching circuits are disposed in the stage following it. Hereinbelow a case where the discharge cells are turned on by image signals will be explained in detail.

In the case where the discharge cells are turned on by the image signal, in general a method, by which the luminance is displayed while transforming it into the time duration, e.g. the time sharing within a field time method is used. By this method one field is divided into e.g. 7 sorts of period, the ratio of the durations being selected so as to be $2^0:2^1:2^2:2^3:2^4:2^5:2^6$ (0 to 6 bits). It is possible to display $2^7=128$ gray levels by combining the seven sorts of period.

FIG. 19 shows a time chart based on this method. In order to turn on the discharge cells, relevant voltages should be applied to the anode electrode A, the cathode electrode K and the subanode electrode SA. Further, in order to represent luminance information, it is necessary to apply townsend pulses $V_T$ to hold the discharge at the anode electrode A. The number of the townsend pulses is assigned according to the time sharing within a field time described above.

FIG. 19 shows waveforms $V_{AT1}$ to $V_{AT3}$ representing the assigned period described above. Here $0^H$ to $24^H$ within one field are indicated. Here $1^H$ corresponds to $63.5 \times 10^{-6}$ sec.

Hereinbelow a period $T_D$ in FIG. 19 will be explained.

In this period of time the discharge cell indicated in FIG. 18 is in the state, where the bit 2 information (b2 of FIG. 19) is turned on. That is, the first line A1 of the anode electrode A is set at the selected state by $V_{A1}$ and when a $V_{S1}$ pulse voltage 70 is applied to the first row SA1 of the subanode electrode SA, a discharge cell 604 is turned on. However, it is supposed that a pulse voltage $V_{K1}$ given to the first line K1 is applied to the cathode electrode K.

When the procedure proceeds in the same way according to the time chart indicated in FIG. 19 such as the second line and the second row, the third line and the third row, and so forth, discharge cells 604, 605, 606, 608 and 611 are turned on by applied pulse voltages 71, 72, 73 and 74 on the subanode SA, voltage pulse series $V_{T1}$, $V_{T2}$ and $V_{T3}$ on the anode electrode A, and voltage pulse series $V_{K11}$, $V_{K21}$ and $V_{K31}$ on the cathode K. This state is indicated by hatching in FIG. 18.

The display signal generating block 613 generates voltage pulses $V_{S1}$, $V_{S2}$ and $V_{S3}$, responding to the luminance signal of the image. On the other hand the scan signal generating block 614 generates voltage pulses $V_{K1}$, $V_{K2}$ and $V_{K3}$ applied to different lines of the cathode electrode K. Further voltage pulses $V_{A1}$, $V_{A2}$ and $V_{A3}$ in FIG. 19 are generated by the pulse-gating generating circuit 615. The energy recovery circuit 600 performs the electric power recovery and the generation of the high voltage pulse $V_{TP}$ in FIG. 19 ($V_{TP}$ is same as $V_{IN}$).

The group of switching circuits 60 extracts pulse series $V_{TP}$ coming successively from the energy recovery circuit 600, responding to pulse-gating pulses $V_{A1}$ to $V_{A3}$ to obtain townsend pulses $V_{T1}$ to $V_{T3}$. A switching circuit 601 in the group of switching circuit 60 receives the high voltage pulse $V_{TP}$ from the energy recovery circuit 600 through a terminal 62. It receives at the same time the pulse-gating signal on a control line C1 of the pulse-gating signal generating circuit through a terminal 61. Then it performs the control of conduction or cut-off for the high voltage pulse $V_{TP}$ to output the townsend pulse $V_{AT1}$ on an output line A1.

Switching circuits 602 and 603 in the group of switching circuits 60 work in the same way.

Consequently the relevant waveforms indicated in FIG. 19 are applied to the anode electrode A and the cathode electrode K. In this way the selected discharge cells are turned on, responding to the signal applied to the subanode electrode SA and thus it is possible to reproduce the image on the display device.

Since the energy recovery circuit requirs an inductor, it is generally difficult to form in an integrated circuit and it is not desirable to dispose an energy recovery circuit for every anode electrode at fabricating the anode driving circuit in the form of an IC. Contrarily thereto, in the case where there are disposed switching circuits according to the present invention, since only one energy recovery circuit is sufficient, an effect is obtained that the anode driving circuit can be fabricated more easily in the form of an IC.

Further, although in the embodiment described above explanation has been made for the case where discharge cells are used as display elements, it is a matter of course that the switching circuit according to the present invention can be used also for driving other display elements, e.g. panels constituted by EL (electroluminescence), liquid crystal, etc., driven by the method, by which pulse voltages are applied time sequencially and intermittently thereto.

Contrarily to the fact that in the above embodiment a switching circuit controlling the conduction and cut-off of the high voltage positive pulse signal has been described, hereinbelow an embodiment of a switch controlling the conduction and cut-off of a high voltage negative pulse signal.

Figure 20:
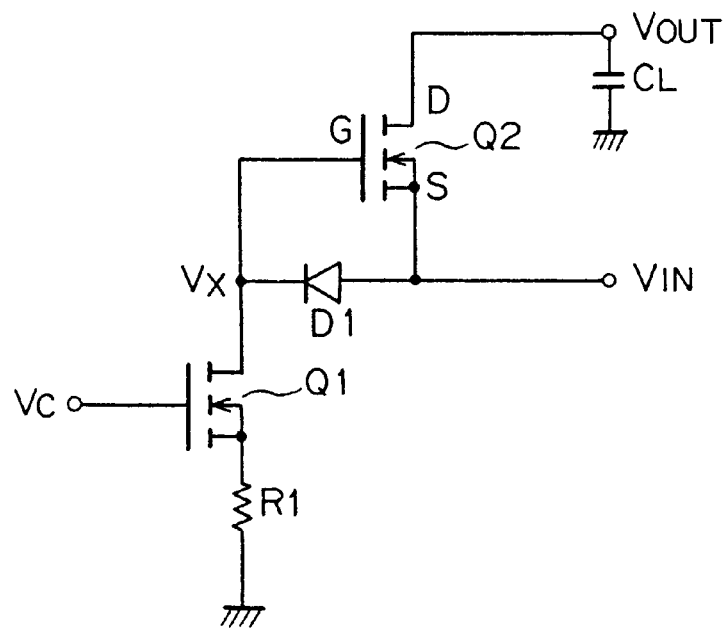
FIG. 20 is a circuit diagram showing an example of the switch for a negative pulse according to the present invention.

FIG. 20 is a circuit diagram showing an embodiment of the present invention, in which Q2 is an N channel MOS transistor, whose source is connected with the body, and in which the input signal voltage $V_{IN}$ is given to the source side and the output signal voltage $V_{OUT}$ is taken out from the source side. Q1 indicates an N channel MOS transistor, which is used as a current drawing-in element, when the transistor Q2 is set forcedly at the OFF state. D1 is a diode used for protecting the gate of the transistor Q2, by means of which it is possible to set the values of the voltage amplitude of $V_{IN}$ and $V_{OUT}$ below the gate withstand voltage for the transistor Q2. It is desirable that D1 is a Zener diode, whose break down voltage is about 5 to 30 V. R1 is a resistor used for suppressing the intensity of the current flowing through the transistor Q1 and it is unnecessary, in the case where electric power consumption due to the current flowing through the transistor Q1 produces no problem.

Figure 21:
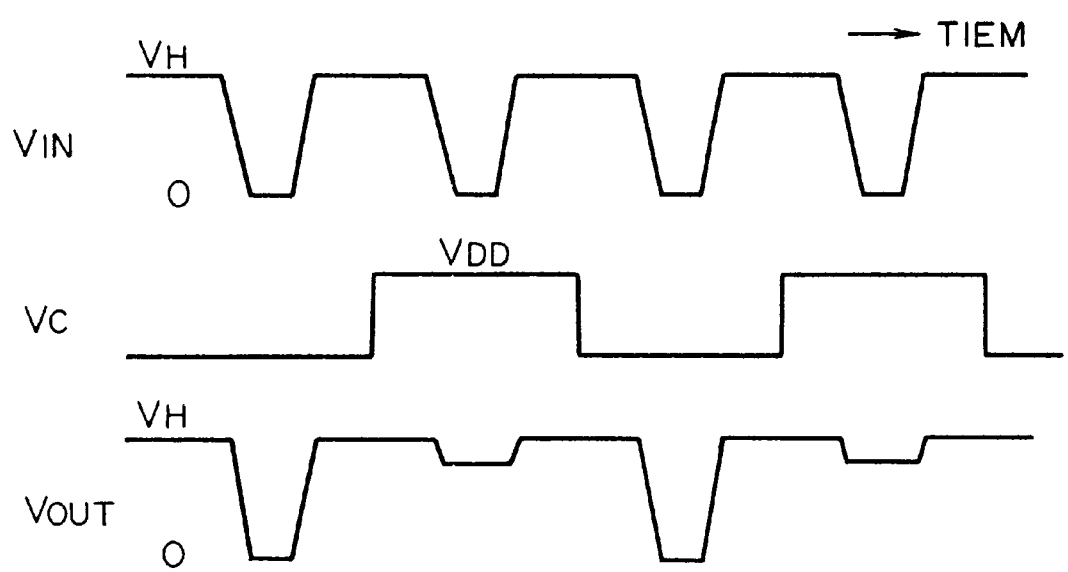
FIG. 21 is a time chart indicating a timing of operation of the circuit indicated in FIG. 20.

FIG. 21 is a time chart showing the method for driving the circuit indicated in FIG. 20. Since there exists a parasitic diode between the drain of the transistor Q2 and the body, in which the drain acts as the cathod and the body acts as the anode, when the input signal voltage $V_{IN}$ having an amplitude $V_H$ is given thereto, in the high voltage state of $V_{IN}$ the output signal voltage $V_{OUT}$ is also in the high voltage state, independently of the state of the control signal voltage $V_C$. When the input signal voltage $V_{IN}$ falls, if the control signal voltage $V_C$ is in the low voltage state (transistor Q1 is turned off), since the voltage $V_x$ has a tendence to be maintained, the transistor is turned to the ON state and the output signal voltage $V_{OUT}$ also falls. However, when the input signal voltage $V_{IN}$ falls, if the control signal voltage $V_C$ is in the high voltage state (transistor Q1 is turned on), since the transistor Q2 is turned forcedly to the OFF state, the output signal voltage $V_{OUT}$ holds almost the high voltage state. Consequently it is possible to control whether the input signal voltage $V_{IN}$ and the output signal voltage $V_{OUT}$ are made pass-through or cut-off, depending on the value of the control signal voltage $V_C$. In this way it can function as a switching circuit for controlling the falling of output voltage with respect to the input pulse inputted through the input terminal $V_{IN}$.

Figure 22:
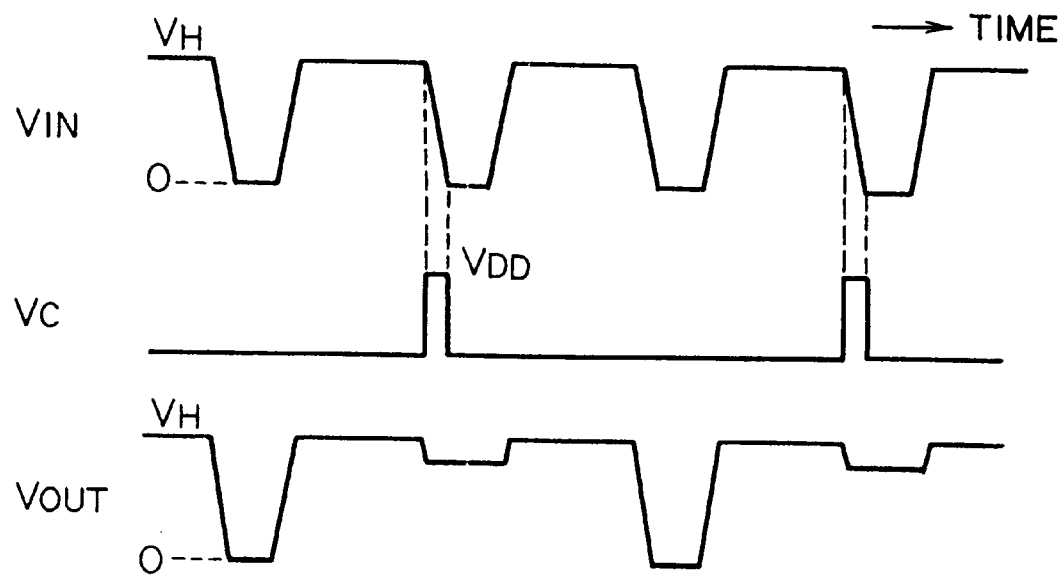
FIG. 22 is a time chart indicating another timing of operation.

FIG. 22 is also another time chart showing the method for driving the circuit indicated in FIG. 20. By the present driving method, only during the period of time, where it is not desired to fall the output signal voltage, the control signal voltage $V_C$ is turned to the high voltage state in synchronism with the fall of the input voltage signal $V_{IN}$. In this way a loss current flowing through the transistor Q1 due to the control signal voltage $V_C$ is reduced, which can decrease the electric power consumption of the circuit.

Figure 23:
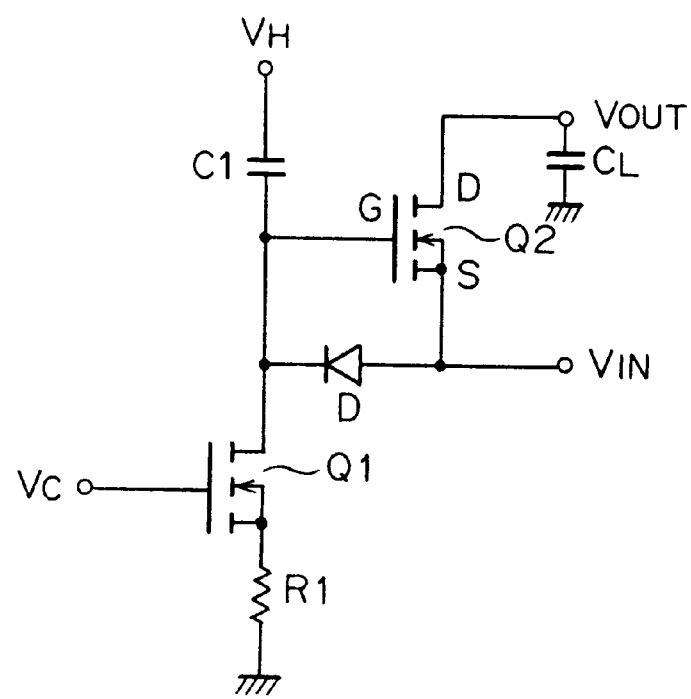
FIGS. 23, 24, 25, 26, 27 and 28 are circuit diagrams showing various embodiments of the present invention.

FIG. 23 is a circuit diagram showing another embodiment of the present invention. In the present embodiment a capacity C1 is added between the $V_X$ section and the high voltage power source $V_H$ in the circuit of the embodiment indicated in FIG. 20 so that when the transistor Q1 is in the OFF state and when the input signal voltage $V_{IN}$ falls, the transistor Q2 is more easily turned on. Although in the present embodiment the capacity C1 is located between the $V_X$ section and the high voltage power source, the same effect can be obtained also by locating it between the $V_X$ section and the ground or the $V_C$ section, etc.

Figure 24:
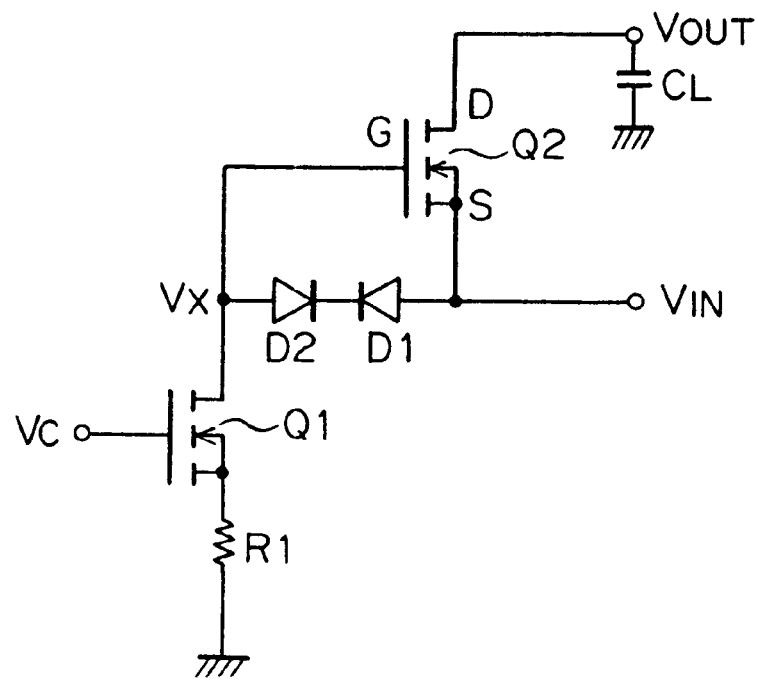

FIG. 24 is a circuit diagram of still another embodiment of the present invention. In the present embodiment a diode D2 is added to the diode D1 in the circuit of the embodiment indicated in FIG. 20, the former being connected in series in the reverse direction with the latter. For this reason, even if the driving method indicated in FIG. 21 is used, it is possible to eliminate the loss current flowing through the transistor Q1, when the control signal voltage $V_C$ is in the high voltage state.

Figure 25:
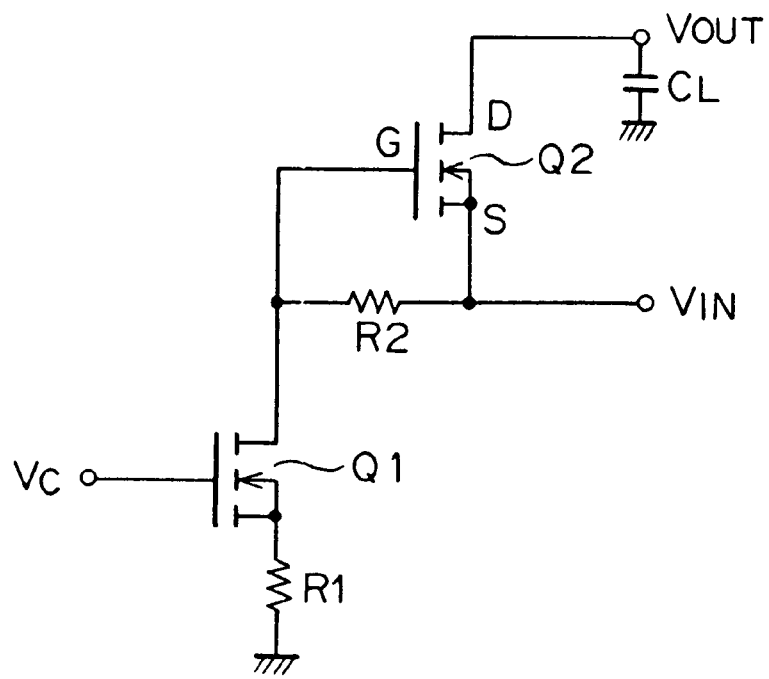

FIG. 25 is a circuit diagram showing still another embodiment of the present invention. In the present invention a resistor R2 is used instead of the diode D1 in the circuit of the embodiment indicated in FIG. 20. For example, in the case where a polycrystalline silicon resistor is used for the resistor R2, it is possible to reduce the occupied area and the parasitic capacity with respect to those of the diode. However, when the resistance of the resistor R2 is too great, it cannot serve as a protection for the gate of the transistor Q2 and on the contrary, when it is too small, it is not possible to turn the transistor to the ON state, when the input signal voltage $V_{IN}$ falls. For this reason attention should be paid to the setting of the resistance.

Figure 26:
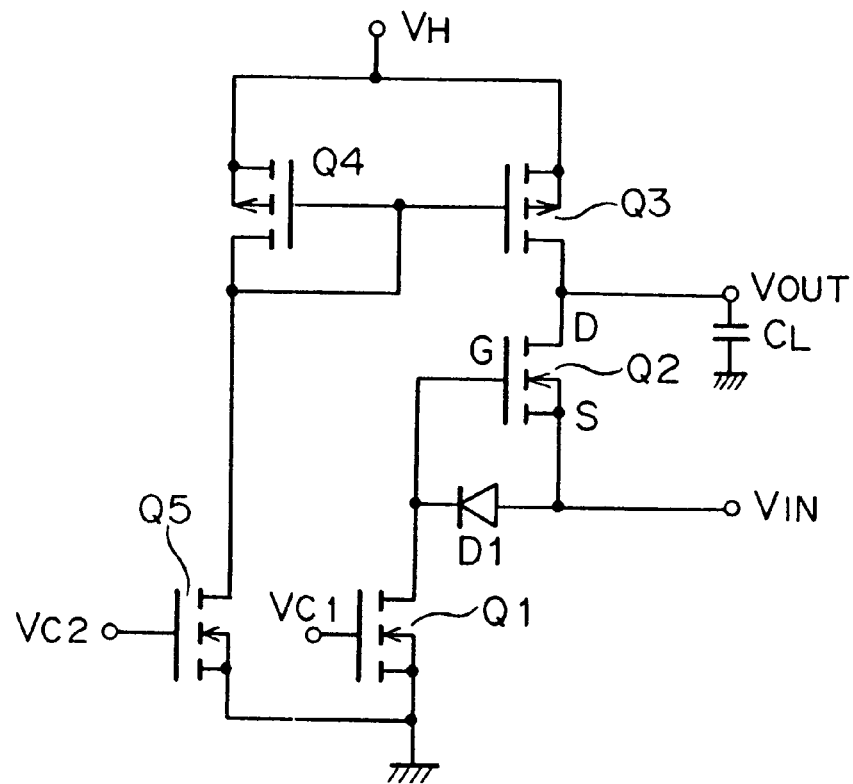

FIG. 26 is a circuit diagram showing still another embodiment of the present invention. Contrarily to the fact that in the embodiment indicated in FIG. 20, etc., even if it is tried to hold the output signal voltage $V_{OUT}$, when the input signal voltage $V_{IN}$ falls, a voltage drop of about 10% of the voltage amplitude of the input signal voltage $V_{IN}$ takes place in the output signal voltage $V_{OUT}$, in the present embodiment two P channel MOS transistors Q3 and Q4 are connected to form a current mirror circuit and the current flowing through the transistor Q3 is controlled by an N channel MOS transistor Q5 in order to prevent this voltage drop and to hold the high voltage state. In order to drive the present circuit, the same driving method as those indicated in FIGS. 21 and 22 can be used, if a first control signal voltage $V_{C1}$ and a second control signal voltate $V_{C2}$ are connected to form the control signal voltage $V_C$.

Figure 27:
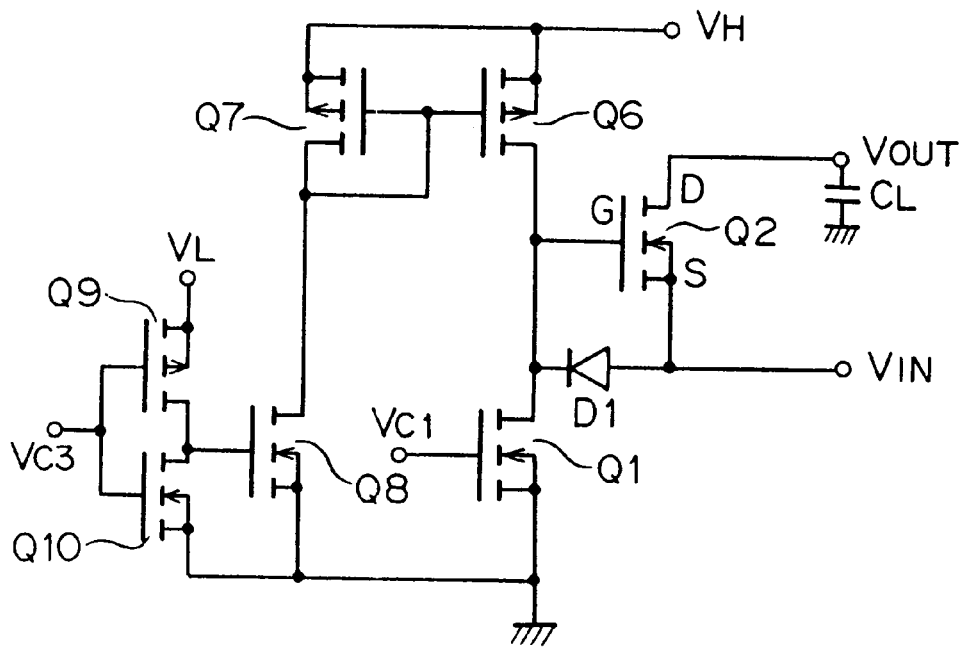

FIG. 27 is a circuit diagram showing still another embodiment of the present invention. In the present embodiment P channel MOS transistors Q6 and Q7 connected to form a current mirror and an N channel MOS transistor Q8 are used as means for supplying current to the gate of the transistor Q2 to set it at the ON state. In the present embodiment, since the output signal voltage can rise in the state where the transistor Q2 is in the ON state, it can be driven without biasing the parasitic diode between the drain of the transistor Q2 and the body in the forward direction. For this reason it is possible to prevent the lowering in the switching speed of the transistor Q2 due to the accumulation of minority carriers. Further, since the transistor Q2 can be set in the ON state, by setting the high voltage power source voltage $V_H$ at a value higher than the maximum voltage $V_{DH}$ of the input signal voltage $V_{IN}$, even if the input signal voltage $V_{IN}$ is in the high state, it is possible to transfer small signals from the input terminal $V_{IN}$ to the output terminal $V_{OUT}$ over a wide voltage range. Further a P channel MOS transistor Q9 and an N channel MOS transistor constitute an inverter and if a first control signal voltage $V_{C1}$ and a third control signal voltage $V_{C3}$ are connected to form the control signal voltage $V_C$, the same driving method as those indicated in FIGS. 21 and 22 can be used.

$V_L$ represents the power source voltage for the signal line.

Figure 28:
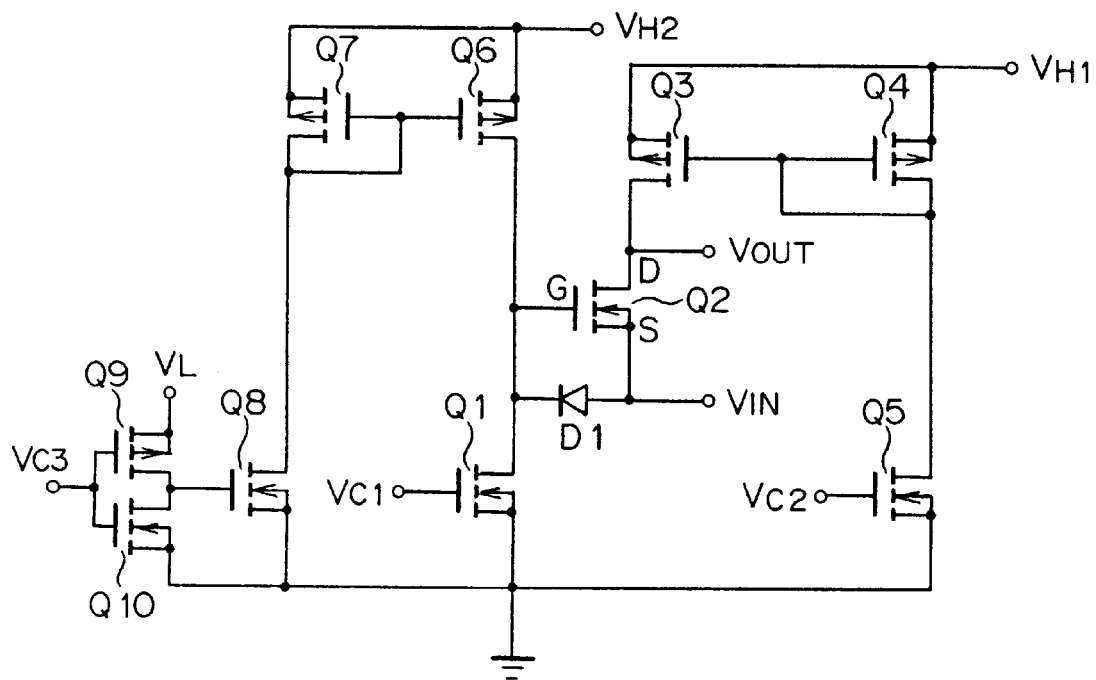

FIG. 28 is a circuit diagram showing still another embodiment of the present invention. The present invention has a structure having the circuit functions indicated in FIGS. 26 and 27. The high voltage power source voltages $V_{H1}$ and $V_{H2}$ may be set at a same level, but by setting one of the high voltage power source voltages $V_{H2}$ at a value higher than the other $V_{H1}$ by about 5 to 20 V, it is possible also to set the transistor Q2 at the ON state, when the input signal voltage $V_{IN}$ is in the high potential level. If three control signal voltages $V_{C1}$, $C_{C2}$ and $V_{C3}$ are connected, the same driving method as those indicated in FIGS. 21 and 22 can be used.

Figure 29:
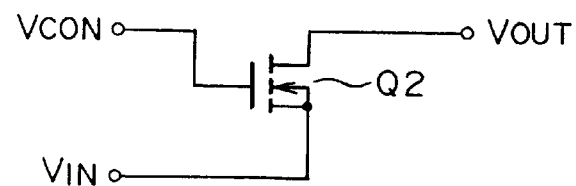
FIG. 29 is a circuit diagram showing the construction of a switch for a negative pulse for a low voltage pulse.

FIG. 29 is a circuit diagram showing still another embodiment of the present invention. The present embodiment is a switching circuit useful, in the case where both the input signal voltage $V_{IN}$ and the output signal voltage $V_{OUT}$ are used at levels below the gate withstand voltage.

Figures 30, 31, 32:
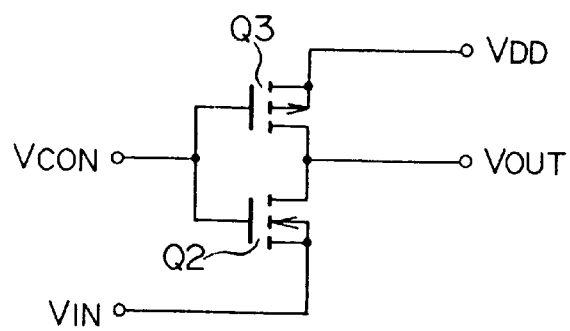
FIG. 30 is a truth-false table showing the operation of the circuit indicated in FIG. 29.
FIG. 31 is a circuit diagram showing another embodiment of the present invention.
FIG. 32 is a truth-false table showing the operation of the circuit indicated in FIG. 31.

FIG. 30 is a truth-false table for the circuit indicated in FIG. 29. In the case where both the control signal voltage $V_C$ and the input signal voltage $V_{IN}$ are in the low voltage state, the output signal voltage $V_{OUT}$ holds the state of the preceding output signal voltage $V_{OUT}$.

FIG. 31 is a circuit diagram showing still another embodiment of the present invention. The present embodiment is also a switching circuit useful for the case where both the input signal voltage $V_{IN}$ and the output signal voltage $V_{OUT}$ are used below the gate withstand voltage.

FIG. 32 is a truth-false table for the circuit indicated in FIG. 31. In the case where both the control signal voltage $V_{CON}$ and the input signal voltage $V_{IN}$ are in the low voltage state, since the P channel MOS transistor Q3 is turned on, the output signal voltage $V_{OUT}$ is in the high voltage state.

Figure 33:
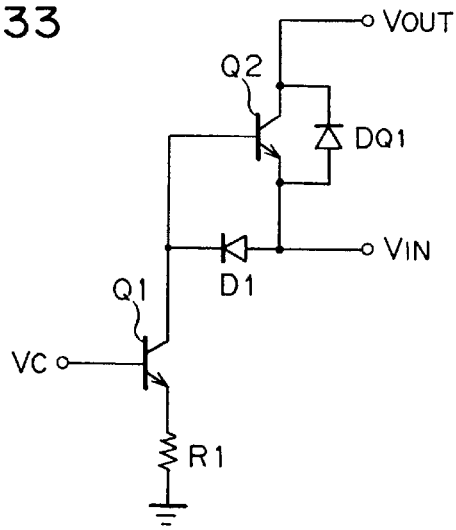
FIG. 33 is a circuit diagram showing an embodiment of the present invention.

FIG. 33 is a circuit diagram showing still another embodiment of the present invention. The present embodiment is a switching circuit, in which the N channel MOS transistor Q2 is replaced by an NPN transistor Q2 and a diode $D_{Q1}$, and the N channel MOS transistor Q1 is replaced by an NPN transistor Q1. In this way the circuits described in the above embodiments can realize circuits having the same effects by replacing the MOS transistor Q2 by a bipolar transistor, with which a diode is connected in parallel.

Figure 34:
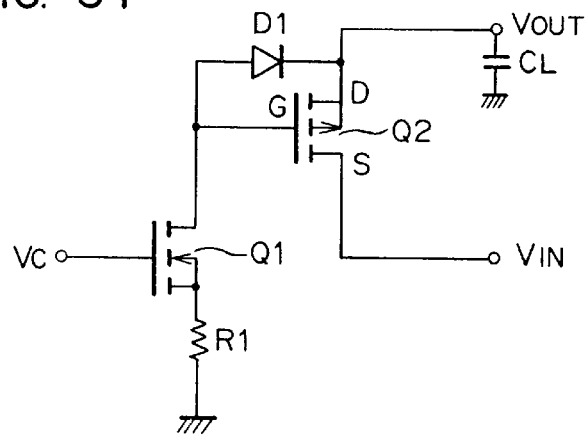
FIG. 34 is a circuit diagram showing another embodiment of the present invention.
Figure 35:
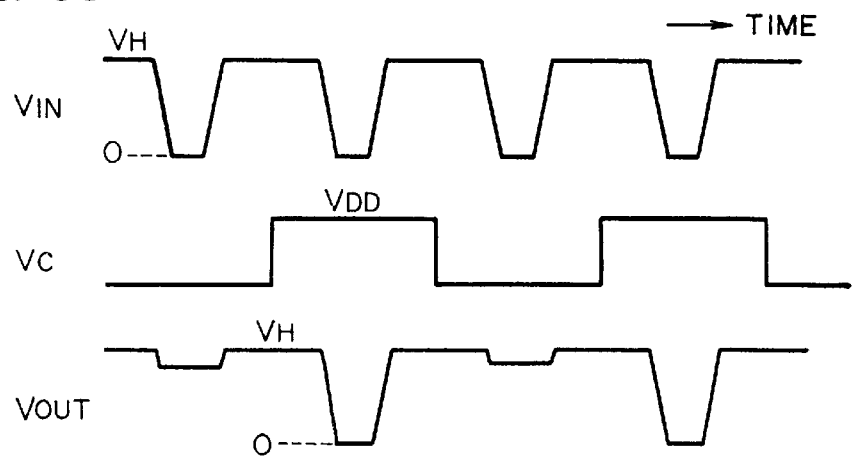
FIG. 35 is a time chart indicating a timing of operation of the circuit indicated in FIG. 34.

FIG. 34 shows another example of the switch for the negative high voltage input signal. The switching element Q2 is a P channel FET, in which the drain is the input signal terminal and the source is the output terminal. A gate bias is given between the source and the gate and further a diode D1 for the protection against excessive voltage is connected. The circuit for driving the gate of the transistor Q2 is an N channel FET Q1. A resistor $R_1$ for limiting current is connected with the source of the FET Q1. Now the working mode of the circuit indicated in FIG. 34 will be explained, referring to a time chart indicated in FIG. 35. $V_{IN}$ represents a negative high voltage input signal and $V_C$ an input signal for controlling the transistor Q1 indicated in FIG. 34. When the input signal $V_C$ is at the "L" level, since the transistor Q1 is turned off, no potential difference is produced between the gate and the source and thus the transistor Q2 is turned off. For this reason, if the voltage of the input signal $V_{IN}$ varies, the output signal $V_{OUT}$ is kept in the high potential state. On the other hand, when the control signal $V_C$ is at "H" level, the transistor Q1 is turned on. For this reason the gate voltage of the transistor Q2 falls, and a voltage is applied between the gate and the source. In this way the transistor Q2 is turned to the ON state and a negative high voltage pulse is produced in the output signal $V_{OUT}$, as indicated in FIG. 35. Here the diode $D_1$ acts as a protection diode between the gate and the source of the transistor Q2. The connection of the two diodes D1 and D2 in series indicated in FIG. 24, the connection of the resistor R2 indicated in FIG. 25, the addition of the function of holding the output voltage indicated in FIG. 26, etc. can be applied to the circuit indicated in FIG. 34, as they are and are included in the present invention.

Figure 36:
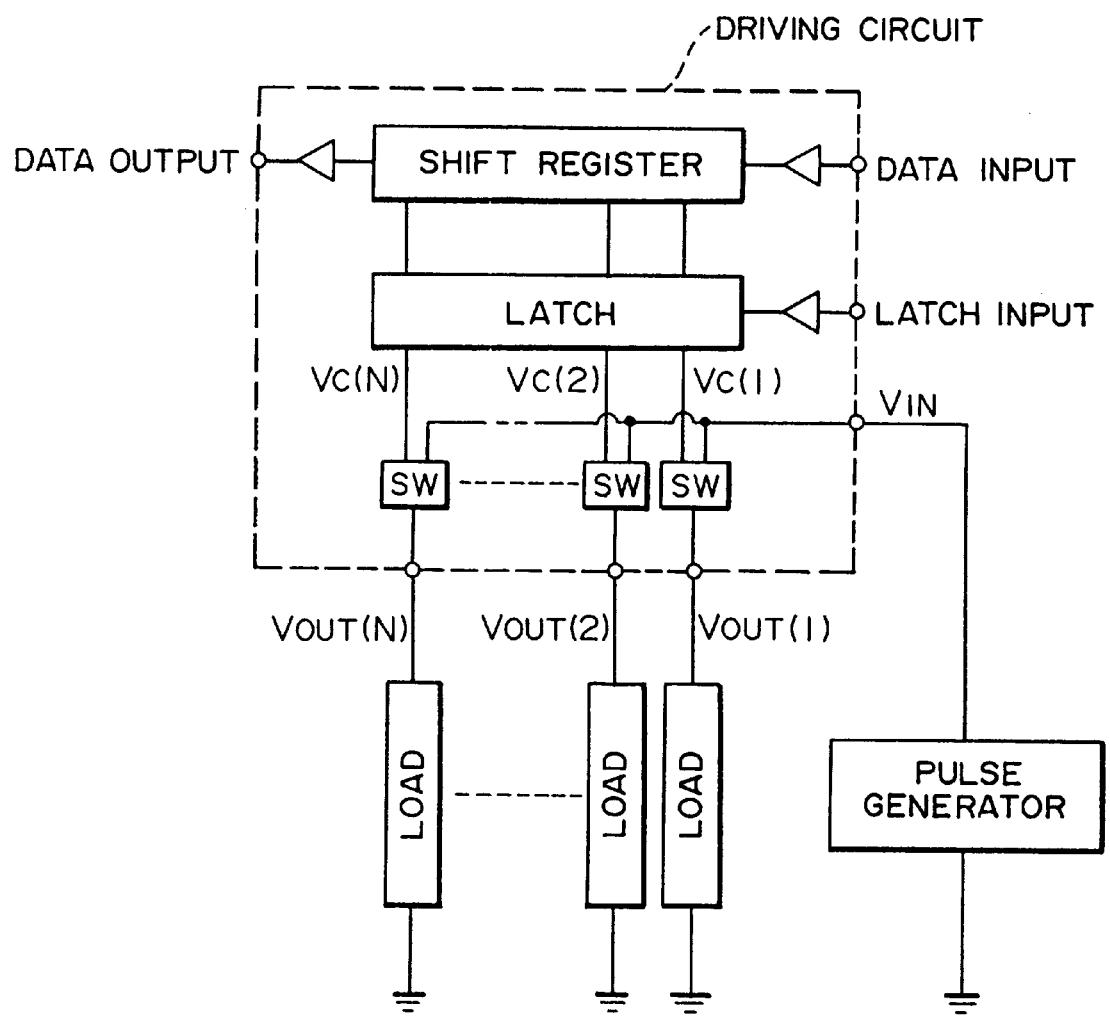
FIG. 36 is a block diagram illustrating a circuit construction using the circuit indicated in FIG. 20.

FIG. 36 is a block circuit diagram illustrating an embodiment of the circuit construction according to the present invention. The present embodiment is so constructed that it is determined by a switching circuit SW opened or closed according to the present invention whether a pulse outputted by a pulse generator should be transmitted to each of more than 2 loads. The opening and shutting of the switching circuit is effected on the basis of control signal voltages $V_C(1)$, $V_C(2)$, - - - , $V_C(N)$ transmitted by a driving circuit. The driving circuit transfers data inputted through a data input terminal in a shift register by using a clock signal to subject them to a serial-parallel transformation and carries out a function to transmit them simultaneously to different switching circuits as the control signal voltage while synchronizing them by means of a latch signal.

In addition, in the circuit indicated in FIG. 36, in the case where the loads are capacitive, the pulse generating circuit can be realized by using an energy recovery circuit (JP-A-61-132997). In this case the electric power transferred from the pulse generator to the loads is returned again from the loads to the pulse generator. In this way a capacitive load driving device of low electric power consumption can be realized.

Figure 37:
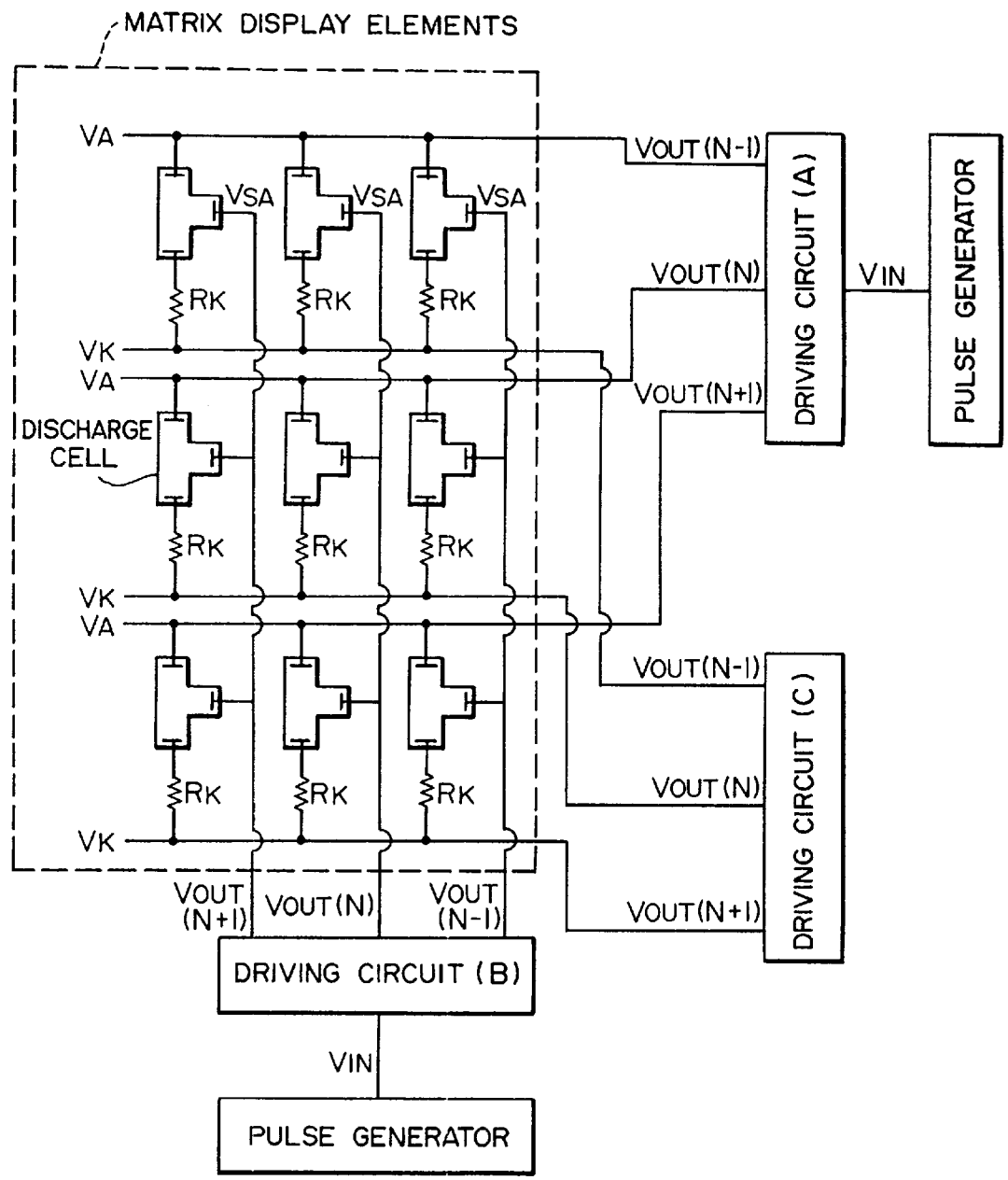
FIG. 37 is a block diagram illustrating a circuit construction, when the present invention is applied to a matrix panel.

FIG. 37 is a circuit block diagram showing an embodiment, in which the present invention is applied to matrix display elements. The present embodiment shows an example, in which a method for driving a matrix display device using switching circuits according to the present invention is used for driving the display device described in Japanese patent application No. 50-113686 as an example.

As indicated in FIG. 37, a discharge cell consists of three electrodes, i.e. an anode, a cathode and an auxiliary anode. While discharge between the anode and the cathode is a display discharge, discharge between the auxiliary anode and the cathode is an auxiliary discharge, which is not observed from the exterior. A cathode resistor $R_K$ is disposed, in order to prevent that the display discharge and the auxiliary discharge take place simultaneously. Denoting the anode voltage by $V_A$, the cathode voltage by $V_K$ and the auxiliary anode voltage by $V_{SA}$, in order to give rise to the display discharge, the following procedure is necessary. That is, (1) start the auxiliary discharge by setting the auxiliary anode voltage $V_{SA}$ at the high level and the cathode voltage $V_K$ at the low level, and then (2) stop the auxiliary to start the display discharge by setting the auxiliary anode voltage $V_{SA}$ at the low level, the cathode voltage $V_K$ at the low level and the anode voltage at the high level.

When in step (2) the auxiliary anode voltage $V_{SA}$ remains at the high level, even if the cathode voltage $V_K$ remains at the low level and the anode voltage $V_A$ is turned to the high level, the auxiliary discharge is not stopped and the display discharge cannot be started.

Utilizing the feature described above of the discharge cell, it is possible to make an arbitrary discharge cell on a display matrix perform the display discharge by using a positive pulse for the anode voltage $V_A$ and a negative pulse for the cathod voltage $V_K$ as the scan signal and a negative pulse for the auxiliary anode voltage $V_{SA}$ as the image signal. In the case of the present embodiment it is possible to reduce the electric pulse consumption in the anode driving circuit and the auxiliary anode circuit with respect to that required according to the prior art technique. A driving circuit (A) incorporating positive pulse switching circuits as indicated in FIG. 1 is used as the switching circuit for the anode driving circuit; a driving circuit (B) incorporating negative pulse switching circuits as indicated in FIG. 20 is used as the switching circuit for the auxiliary anode driving circuit; and a prior art push-pull type driving circuit (C) is used for driving the cathode. In this way it is possible to realize a display device permitting low electric power consumption drive. Further the driving method described in the present embodiment can be applied to general capacitive load driving devices such as plasma displays, EL (electroluminescence) displays, vacuum fluorescent displays, piezo electric devices, etc.

What is claimed is:

1. A display device comprising:

a plurality of discharge cells, each having at least first, second and third electrodes;

a scan signal generating circuit connected to said first electrodes of said plurality of discharge cells, said scan signal generating circuit arranged to apply scan pulses to said first electrodes;

a display signal generating circuit connected to said second electrodes of said plurality of discharge cells, said display signal generating circuit arranged to apply display pulses to said second electrodes;

switching circuits, each electrically connected to said third electrodes of corresponding ones of said plurality of discharge cells;

a pulse-gating signal generating circuit configured to provide gating signals to said switching circuits; and an energy recovery circuit electrically connected to said switching circuits, wherein said switching circuits are arranged to apply pulses from said energy recovery circuit to said third electrode of corresponding ones of said plurality of discharge cells to charge electric charge in at least a selected one of said corresponding ones of said plurality of discharge cells, and are further arranged to recover said electric charge from said at least a selected one of said corresponding ones of said plurality of discharge cells to said energy recovery circuit, wherein each of said switching circuits comprises:

a first MOS transistor having a gate, a drain, and a source, said drain serving as an input terminal for said pulse and said source serving as an output terminal for said pulse;

a diode connected to said gate and said source;

a resistor connected to said gate and said source;

a constant current supply transistor having a control voltage input terminal configured to receive one of said gating signals from said pulse-gating signal generating circuit and a constant current supply output terminal connected to said gate; and a voltage hold circuit connected to said source, said voltage hold circuit selectively maintaining said source potential at a predetermined voltage;

wherein said constant current supply transistor, in response to said one of said gating signals, selectively outputs a control voltage signal to said gate to switch ON and OFF said first MOS transistor to selectively supply said pulse.

2. A device according to claim 1 wherein said control voltage signal is a negative pulse synchronized with said pulse.

3. A display device comprising:

a plurality of discharge cells, each having at least first, second and third electrodes;

a scan signal generating circuit connected to said first electrodes of said plurality of discharge cells, said scan signal generating circuit arranged to apply scan pulses to said first electrodes;

a display signal generating circuit connected to said second electrodes of said plurality of discharge cells, said display signal generating circuit arranged to apply display pulses to said second electrodes;

switching circuits, each electrically connected to said third electrodes of corresponding ones of said plurality of discharge cells;

a pulse-gating signal generating circuit configured to provide gating signals to said switching circuits; and an energy recovery circuit electrically connected to said switching circuits, wherein said switching circuits are arranged to apply pulses from said energy recovery circuit to said third electrode of corresponding ones of said plurality of discharge cells to charge electric charge in at least a selected one of said corresponding ones of said plurality of discharge cells, and are further arranged to recover said electric charge from said at least a selected one of said corresponding ones of said plurality of discharge cells to said energy recovery circuit, wherein each of said switching circuits comprises:

an MOS transistor having a gate, a drain, and a source, said source serving as an input terminal for said pulse and said drain serving as an output terminal for said pulse;

a diode connected to said gate and said source; and a constant current supply transistor having a control voltage input terminal configured to receive one of said gating signals from said pulse-gating signal generating circuit and a constant current supply output terminal connected to said gate;

wherein said constant current supply transistor, in response to said one of said gating signals, selectively outputs a control voltage signal to said gate to switch ON and OFF said MOS transistor to selectively supply said pulse, and wherein said control voltage signal is synchronized with said pulse.

4. A device according to claim 2 wherein said voltage hold circuit comprises a second MOS transistor having a gate, a drain and a source, wherein said drain of said second MOS transistor is connected to said source of said first MOS transistor, and a hold input signal is applied to said gate of said second MOS transistor.

5. A display device comprising:

a plurality of discharge cells, each having at least first, second and third electrodes;

a scan signal generating circuit connected to said first electrodes of said plurality of discharge cells, said scan signal generating circuit arranged to apply scan pulses to said first electrodes;

a display signal generating circuit connected to said second electrodes of said plurality of discharge cells, said display signal generating circuit arranged to apply display pulses to said second electrodes;

switching circuits, each electrically connected to said third electrodes of corresponding ones of said plurality of discharge cells;

a pulse-gating signal generating circuit configured to provide gating signals to said switching circuits; and an energy recovery circuit electrically connected to said switching circuits, wherein said switching circuits are arranged to apply pulses from said energy recovery circuit to said third electrode of corresponding ones of said plurality of discharge cells to charge electric charge in at least a selected one of said corresponding ones of said plurality of discharge cells, and are further arranged to recover said electric charge from said at least a selected one of said corresponding ones of said plurality of discharge cells to said energy recovery circuit, wherein each of said switching circuits comprises:

a first MOS transistor having a first gate, a first drain, and a first source, said first drain serving as an input terminal for said pulse and said first source serving as an output terminal for said pulse;

a diode connected to said first gate and said first source;

a constant current supply transistor having a control voltage input terminal configured to receive one of said gating signals from said pulse-gating signal generating circuit and a constant current supply output terminal connected to said first gate; and means connected to said first gate and to said first drain for raising the potential at said first gate;

wherein said constant current supply transistor, in response to said one of said gating signals, selectively outputs a control voltage signal to said gate to switch ON and OFF said first MOS transistor to selectively supply said pulse.

6. A device according to claim 5 wherein said control voltage signal is a negative pulse synchronized with said pulse.

7. A device according to claim 5 wherein said means is a second MOS transistor having a second gate, a second drain and a second source, said second gate and second source being connected to said first drain and said second drain being connected to said first gate.

8. A display device comprising:

a plurality of discharge cells each having at least first, second and third electrodes;

a scan signal generating circuit coupled to said first electrodes of said plurality of discharge cells and arranged to apply scan pulses to said first electrodes of said plurality of discharge cells;

a display signal generating circuit coupled to said second electrodes of said plurality of discharge cells and arranged to apply display pulses to said electrodes of said plurality of discharge cells;

switching circuits each electrically coupled to said third electrodes of corresponding ones of said plurality of discharge cells; and an energy recovery circuit electrically coupled to said switching circuits, wherein said switching circuits are arranged to apply pulses from said energy recovery circuit in response to a signal to said third electrodes of corresponding ones of said plurality of discharge cells thereby to charge electric charge in at least a selected one of said corresponding ones of said plurality of discharge cells, and are further arranged to recover the electric charge from said at least a selected one of said corresponding ones of said plurality of discharge cells to said energy recovery circuit;

each of said switching circuits includes a MOS transistor having a gate, a drain and a source, said drain serving as an input terminal for receiving said pulse from said energy recovery circuit and said source serving as an output terminal for outputting said pulse to said third electrodes of corresponding ones of said plurality of discharge cells, a diode coupled between said gate and said source of said MOS transistor, a resistor coupled between said gate and said source of said MOS transistor, and a constant current supply transistor having a control voltage input terminal for receiving said signal from said pulse-gating signal generating circuit and a constant current supply output terminal coupled to said gate of said MOS transistor, wherein said constant current supply transistor selectively outputs from said constant current supply output terminal, in response to said signal from said pulse-gating signal generating circuit, a control voltage signal to said gate to switch ON and OFF said MOS transistor thereby to selectively output said pulse from said source.

9. A display device comprising:

a plurality of discharge cells each having at least first, second and third electrodes;

a scan signal generating circuit coupled to said first electrodes of said plurality of discharge cells and arranged to apply scan pulses to said first electrodes of said plurality of discharge cells;

a display signal generating circuit coupled to said second electrodes of said plurality of discharge cells and arranged to apply display pulses to said second electrodes of said plurality of discharge cells;

switching circuits each electrically coupled to said third electrodes of corresponding ones of said plurality of discharge cells; and an energy recovery circuit electrically coupled to said switching circuits, wherein said switching circuits are arranged to apply pulses from said energy recovery circuit in response to a signal from a pulse-gating signal generating circuit to said third electrodes of corresponding ones of said plurality of discharge cells thereby to charge electric charge in at least a selected one of said corresponding ones of said plurality of discharge cells, and are further arranged to recover the electric charge from said at least a selected one of said corresponding ones of said plurality of discharge cells to said energy recovery circuit;

each of said switching circuits includes a MOS transistor having a gate, a drain and a source, said source serving as an input terminal for receiving said pulse from said energy recovery circuit and said drain serving as an output terminal for outputting said pulse to said third electrodes of corresponding ones of said plurality of discharge cells, a diode coupled between said gate and said source of said MOS transistor, and a constant current supply transistor having a control voltage input terminal for receiving said signal from said pulse-gating signal generating circuit and a constant current supply output terminal coupled to said gate of said MOS transistor, wherein said constant current supply transistor selectively outputs from said constant current supply output terminal, in response to said signal from said pulse-gating signal generating circuit, a control voltage signal to said gate to switch ON and OFF said MOS transistor thereby to selectively output said pulse from said source, and wherein said control voltage signal is synchronized with said pulse.

\* \* \* \* \*